United States Patent [19]
Morimoto

[11] Patent Number: 6,025,763
[45] Date of Patent: Feb. 15, 2000

[54] RESONATOR-TYPE SURFACE-ACOUSTIC-WAVE LADDER FILTER WITH IMPROVED UPPER STOPBAND ATTENUATION AND REDUCED INSERTION LOSS

[75] Inventor: Shigeyuki Morimoto, Tokyo, Japan

[73] Assignee: Oki Electric Industry Co., Ltd., Tokyo, Japan

[21] Appl. No.: 08/789,582

[22] Filed: Jan. 28, 1997

[30] Foreign Application Priority Data

Mar. 14, 1996 [JP] Japan .................. 8-057150

[51] Int. Cl.⁷ .................. H03H 9/25; H03H 9/64
[52] U.S. Cl. .................. 333/195; 333/196; 310/313 C; 310/313 D
[58] Field of Search .................. 333/193–196; 310/313 R, 313 B, 313 C, 313 D

[56] References Cited

U.S. PATENT DOCUMENTS

| | | | |
|---|---|---|---|
| 5,638,036 | 6/1997 | Penunuri et al. | 310/313 B X |
| 5,654,680 | 8/1997 | Kuwan et al. | 310/313 C X |

FOREIGN PATENT DOCUMENTS

| | | | |
|---|---|---|---|
| 0 758 819 A1 | 2/1997 | European Pat. Off. | |
| 44 08 989 A1 | 12/1994 | Germany | |
| 55-49022 | 4/1980 | Japan | 310/313 C |
| 57-17217 | 1/1982 | Japan | 333/195 |
| 2-220510 | 9/1990 | Japan | 333/195 |
| 2-270416 | 11/1990 | Japan | 333/195 |
| 6-164297 | 6/1994 | Japan | 333/194 |

OTHER PUBLICATIONS

Yoshio Satoh et al, "A low–loss band–pass filter using SAW–resonators connected into ladder type circuit," IEICE Technical Report US9–52 (Sep. 1992), pp. 9–16.

"Design Methodology and Experimental Results for New Ladder–Type SAW Resonator Coupled Filters", Hikita et al, IEEE Transactions on Ultrasonics, Ferroelectrics, and Frequency Control, vol. 42, No. 4, Jul. 1995, pp. 495–508.

"A Ladder Filter Using One–Port SAW Resonators", Technical Report of the Institute of Electronics, Information, and Communication Engineers, US95–25, EMD95–21, CPM95–33 (1995–07), pp. 39–46.

*Primary Examiner*—Robert Pascal
*Assistant Examiner*—Barbara Summons
*Attorney, Agent, or Firm*—Venable; Robert J. Frank; Allen Wood

[57] ABSTRACT

In a resonator-type SAW filter, at least one series-arm SAW resonator has an interdigital transducer with reflectors on both sides, and the reflectors are separated from the interdigital transducer by a distance of from $(N/2+0.55)\lambda_1$ to $(N/2+0.81)\lambda_1$, where N is an arbitrary non-negative integer and $\lambda_1$ is the wavelength of the surface acoustic waves excited by the SAW resonator. Alternatively, from 30% to 80% of the electrode fingers Constituting the interdigital transducer in at least one series-arm SAW resonator are apodized, dividing the interdigital transducer into an excitation region and a dummy region, and the electrode fingers in the dummy region are offset from the electrode fingers in the excitation region by a distance of $0.05\lambda_1$ to $0.31\lambda_1$.

43 Claims, 27 Drawing Sheets

(t=0.750 λ)

(t=0.875 λ)

RESONATOR-TYPE SURFACE-ACOUSTIC-WAVE LADDER FILTER WITH IMPROVED UPPER STOPBAND ATTENUATION AND REDUCED INSERTION LOSS

BACKGROUND OF THE INVENTION

The present invention relates to a resonator-type surface-acoustic-wave filter with reduced insertion loss.

The resonator-type surface-acoustic-wave filters (referred to below as resonator-type SAW filters) considered in the present invention have the well-known ladder circuit configuration. The ladder configuration does not require a matching circuit, and has such further advantages as low loss, high attenuation, and narrow bandwidth, but there is a trade-off between loss and attenuation. If the ladder configuration contains only one stage, or a small number of stages, insertion loss is low but attenuation in the stopbands may be inadequate. With a large number of stages, stopband attenuation improves but insertion loss increases, and the filter becomes large in size.

A known solution to this problem couples one or more additional SAW resonators in series with the ladder circuit to improve the stopband attenuation. The present invention addresses this problem in the upper stopband, so the conventional solution would be to provide an additional SAW resonator with frequency characteristics adapted to improve the attenuation in that stopband. This solution is unsatisfactory in the following respects. First, the additional SAW resonator increases the insertion loss to some extent. Second, impedance matching characteristics are worsened, because the resonant frequency of the additional SAW resonator lies above the passband of the filter. (This is because the antiresonant frequency of the additional SAW resonator must be higher than the antiresonant frequency of the SAW resonator or resonators in the series arm of the filter.) Third, the additional SAW resonator increases the size of the filter.

SUMMARY OF THE INVENTION

It is accordingly an object of the present invention to improve the upper stopband attenuation characteristic of a resonator-type SAW filter without requiring an extra SAW resonator to be added for this purpose.

A further object is to improve the flatness of the passband of a resonator-type SAW filter.

A still further object is to reduce the size of a resonator-type SAW filter.

The invented resonator-type SAW filter has at least one series-arm SAW resonator and at least one shunt-arm SAW resonator. Each SAW resonator comprises an interdigital transducer and a pair of reflectors, disposed on opposite sides of the interdigital transducer, although in some cases the reflectors may be absent.

According to a first aspect of the invention, in at least one series-arm SAW resonator, the reflectors are separated from the interdigital transducer by a distance in the range from $(N/2+0.55)\lambda_1$ to $(N/2+0.81)\lambda_1$, where N is an arbitrary non-negative integer (preferably zero), and $\lambda_1$ is the wavelength of the surface acoustic waves excited by the resonator. This spacing between the interdigital transducer and reflectors produces a new pole of attenuation that improves the attenuation characteristic of the upper stopband.

According to a second aspect of the invention, the interdigital transducers in all of the shunt-arm SAW resonators, or in at least one of the series-arm SAW resonators, or in all of the shunt-arm SAW resonators and at least one of the series-arm SAW resonators, are apodized. When the shunt-arm SAW resonators are apodized, at least half of the electrode fingers constituting each interdigital transducer are apodized. When a series-arm SAW resonator is apodized, from thirty to eighty percent of the electrode fingers are apodized. The apodization improves the flatness of the passband.

Apodizing of the electrode fingers creates within the interdigital transducer an excitation region and a dummy region, each apodized electrode finger comprising a first part disposed in the excitation region and a second part disposed in the dummy region. The dummy region acts as a reflector within the interdigital transducer, so the above-mentioned reflectors on both sides of the interdigital transducer can be reduced in size, or in some cases eliminated altogether.

When the second aspect of the invention is applied to a series-arm SAW resonator, the first part of each apodized electrode finger is preferably offset from the second part, in the direction of propagation of the acoustic waves, by a distance in the range from $0.05\ \lambda_1$ to $0.31\ \lambda_1$, and the reflectors (if present) are disposed at a distance of $\lambda_1/2$ from the interdigital transducer. This produces the same effect as the $(N/2+0.55)\lambda_1$ to $(N/2+0.81)\lambda_1$ spacing between the interdigital transducer and reflectors in the first aspect of the invention.

BRIEF DESCRIPTION OF THE DRAWINGS

In the attached drawings:

FIG. 2A-1 illustrates a series-arm SAW resonator according to the first aspect of the invention;

FIG. 2A-2 is an enlarged view of a portion of FIG. 2A-1;

FIG. 2B-1 illustrates a conventional series-arm SAW resonator;

FIG. 2B-2 is an enlarged view of a portion of FIG. 2B-1;

DETAILED DESCRIPTION OF THE INVENTION

Figure 1:
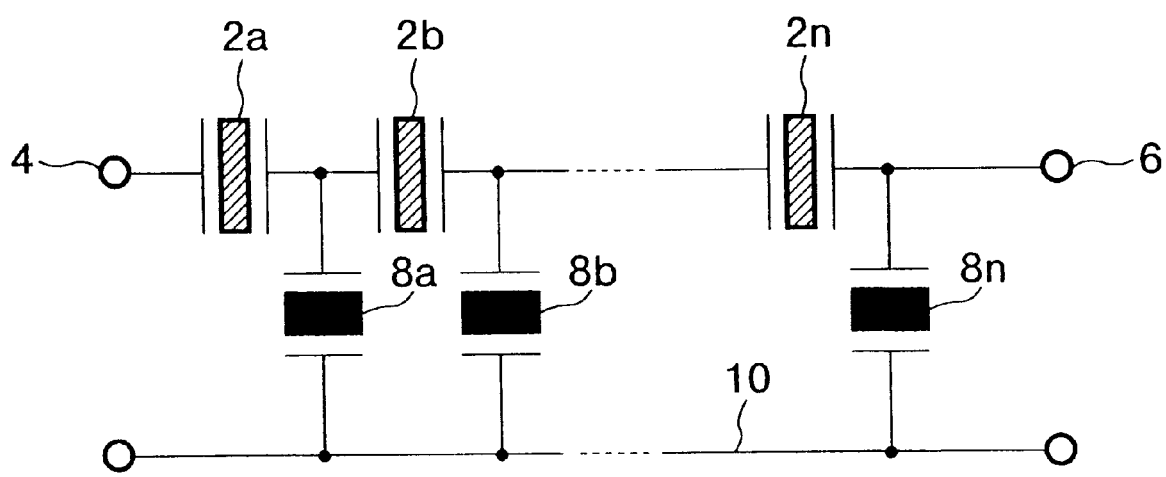
FIG. 1 is an electrical equivalent circuit diagram of a resonator-type SAW filter.

Embodiments of the invention will be described with reference to the attached illustrative drawings. The drawings are shown to provide an understanding of the invention, and do not necessarily represent the exact sizes, shapes, or positional relationships of component elements. Identical reference numerals are attached to identical or similar elements in each drawing, and redundant descriptions of these elements will be omitted. Common abbreviations such as MHz (megahertz) and dB (decibels) will be employed.

Basic Resonator-type SAW Filter Configuration

FIG. 1 is an electrical equivalent circuit diagram of a resonator-type SAW filter with a ladder circuit configuration comprising n series-arm SAW resonators 2a to 2n coupled in series between an input terminal 4 and an output terminal 6, and n shunt-arm SAW resonators 8a to 8n coupled in parallel between the series arm and a ground line 10 (n is an arbitrary positive integer). Both the first and second aspects of the invention have this general configuration. The number of series-arm SAW resonators may be equal to the number of shunt-arm SAW resonators, as shown, or these two numbers may differ by one, as in a T-type or π-type ladder configuration. The number of series-arm SAW resonators may be one, or more than one.

The ladder-circuit in FIG. 1 is said to have 2n−1 stages. Resonators 2a and 8a constitute the first stage, resonators 8a and 2b constitute the second stage, resonators 2b and 8b constitute the third stage, and resonators 2n and 8n constitute the last stage.

In the following descriptions, reference numeral 2 will denote an arbitrary one of the series-arm SAW resonators 2a to 2n, and reference numeral 8 will denote an arbitrary one of the shunt-arm SAW resonators 8a to 8n.

First Aspect of the Invention

Figures 1, 2A:
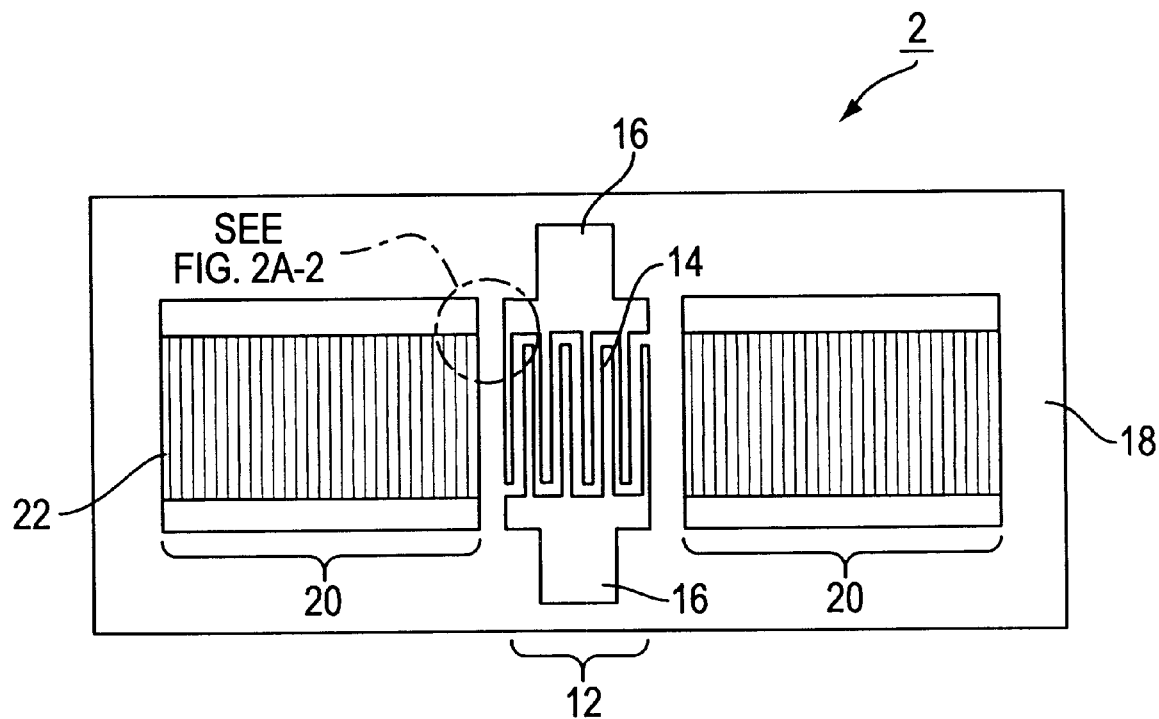

FIG. 2A-1 illustrates the structure of at least one of the series-arm SAW resonators 2 according to the first aspect of the invention. This SAW resonator comprises an interdigital transducer (IDT) 12 having electrode fingers 14 connected alternately to a pair of terminals 16. The electrode fingers 14 and terminals 16 are formed by the patterning of a conductive film on a piezoelectric substrate 18. All SAW resonators in the filter are preferably formed on the same substrate 18. The interconnecting terminals 16 serve to couple adjacent series-arm SAW resonators 2, or serve as the input terminal 4 or output terminal 6 of the filter.

The electrode fingers 14 are disposed at intervals of $\lambda_1/2$, where $\lambda_1$ is the desired wavelength of the surface acoustic wave to be excited by the SAW resonator. That is, the distance between the center lines of any two adjacent electrode fingers 14 is $\lambda_1/2$.

A pair of reflectors 20 comprising metal-slit gratings 22, in which metal fingers 24 alternate with slits, are disposed on opposite sides of the interdigital transducer 12. The metal fingers 24 are also disposed at intervals of $\lambda_1/2$. The distance t between the interdigital transducer 12 and each reflector 20, meaning the distance between the center line of the finger electrode 14 closest to the reflector 20 and the center line of the metal finger 24 closest to the interdigital transducer 12 (see FIG. 2A-2), satisfies the following condition A:

Condition A: $(N/2+0.55)\lambda_1 \leq t \leq (N/2+0.81)\lambda_1$

The letter N in condition A represents an arbitrary non-negative integer (zero or a positive integer).

In the first aspect of the invention, at least one series-arm SAW resonator 2 satisfies condition A. If two or more series-arm SAW resonators satisfy condition A, these series-arm SAW resonators may all have the same value of t, or some of them may have differing values of t, or they may all have different values of t.

Figures 2, 2A:
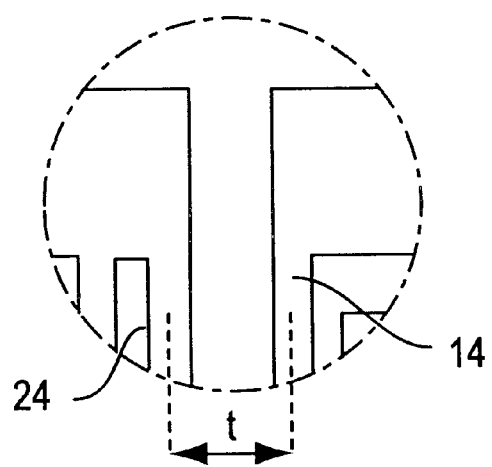
Figures 1, 2B:
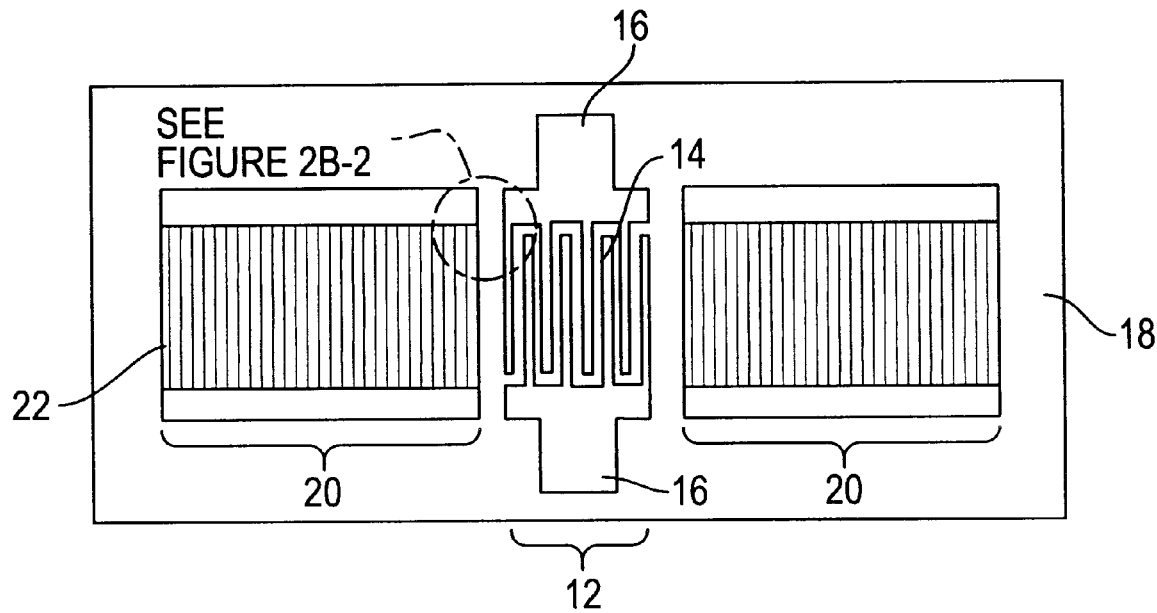
Figures 2, 2B:
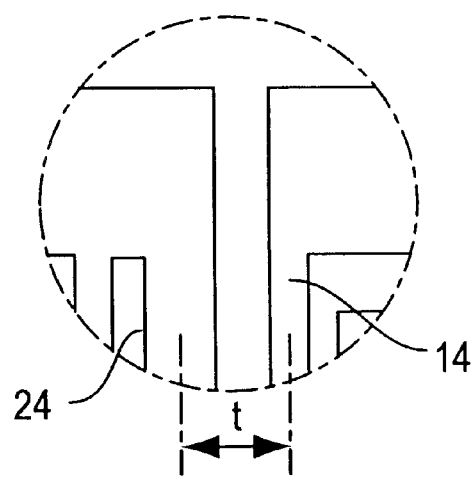

If there are any series-arm SAW resonators 2 that do not satisfy condition A, these series-arm SAW resonators have the structure shown in FIG. 2B-1. This structure is the same as in FIG. 2A-1 except for the spacing between the interdigital transducer 12 and reflectors 20: the distance t is now equal to $\lambda_1/2$, the same as the spacing between electrode fingers 14 in the interdigital transducer 12 and the spacing between metal fingers 24 in the reflectors 20 (see FIG. 2B-2). This is the normal or conventional value of t, employed in resonator-type SAW filters in the prior art.

The shunt-arm SAW resonators 8 may also have the structure shown in FIG. 2B-2, except that the value of t is $\lambda_2/2$ instead of $\lambda_1/2$, where $\lambda_2$ is the desired wavelength of the surface acoustic waves to be excited in the shunt-arm SAW resonators 8 ($\lambda_2$ is different from $\lambda_1$). An alternative and preferred structure of the shunt-arm SAW resonators 8 will be described later, however, under the second aspect of the invention.

The interdigital transducers 12 and reflectors 20 in both the series-arm and shunt-arm SAW resonators comprise, for example, patterned films of aluminum, copper, or an aluminum alloy containing a few percent of silicon. To suppress spurious components due to a surface-skimming bulk wave (SSBW), the film thickness H of the interdigital transducers 12 should satisfy the well-known condition $H/\lambda \geq C$, where $\lambda$ is the desired wavelength of the surface acoustic wave ($\lambda_1$ or $\lambda_2$), and C is an appropriate constant. In an 800-MHz-band resonator-type SAW filter with a passband bandwidth of 25 MHz, fabricated on a 36° rotated Y-cut LiTaO$_3$ piezoelectric substrate 18, C has a value in the range from 0.08 to 0.1.

Figure 3:
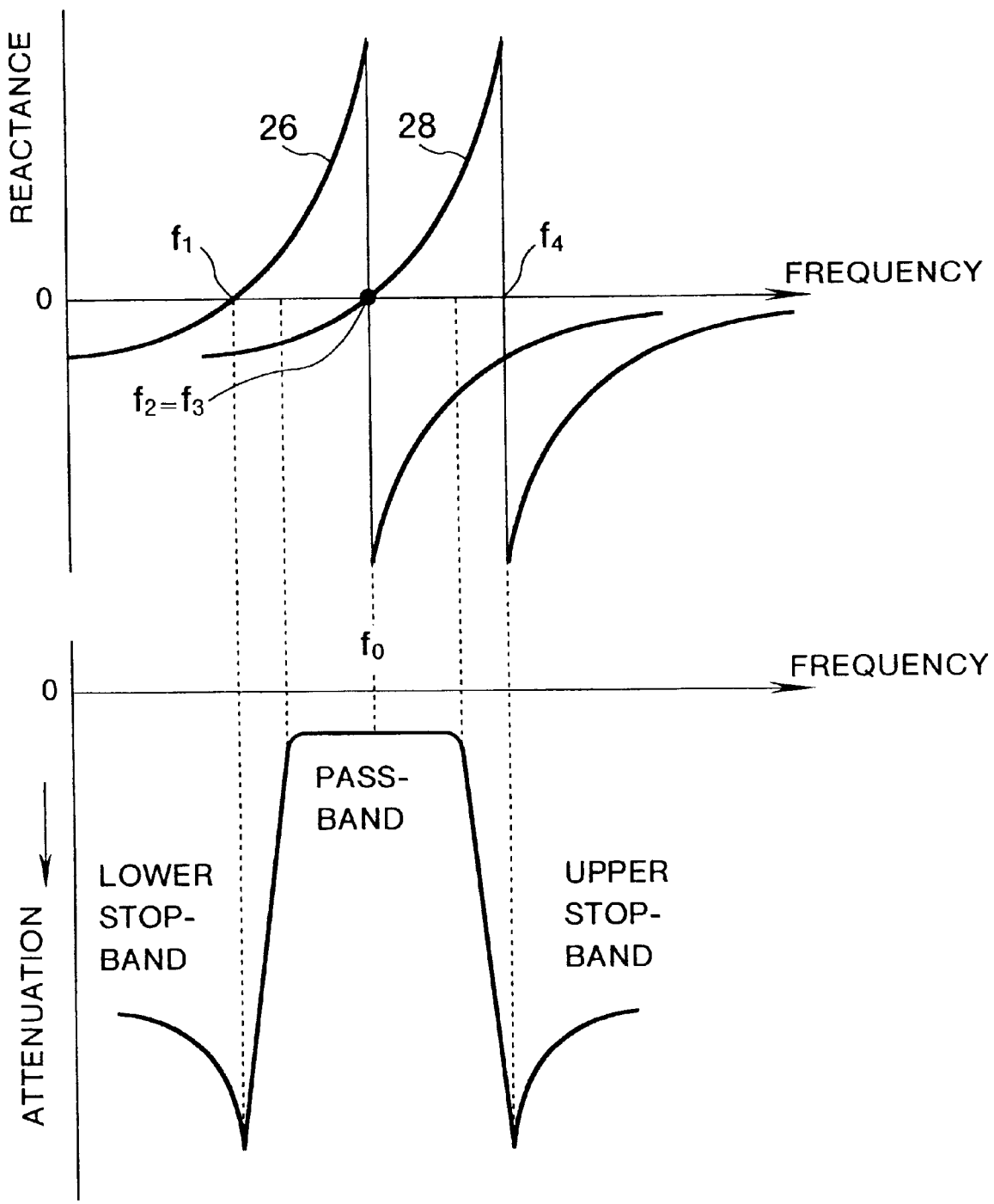
FIG. 3 illustrates frequency relationships in a resonator-type SAW filter.

FIG. 3 illustrates the frequency response of a single-stage resonator-type SAW filter, with frequency shown on the horizontal axis, and reactance and attenuation shown separately on the vertical axis. The reactance characteristic 26 of the shunt-arm SAW resonator 8 shows a resonant frequency $f_1$ and antiresonant frequency $f_2$. The reactance characteristic 28 of the series-art SAW resonator 2 shows a resonant frequency $f_3$ and antiresonant frequency $f_4$. The SAW resonators are designed so that $f_2$ is substantially equal to $f_3$, making both substantially equal to the center frequency $f_0$ of the passband. Multi-stage resonator-type SAW filters are designed in the same way.

FIGS. 4A to 4E illustrate the basis for condition A. Each shows the transfer characteristic of a single SAW resonator, coupled in series between input and output terminals like the series-arm SAW resonators 2 in the filter. Frequency is shown on the horizontal axis (20 MHz per division) and attenuation on the vertical axis (5 dB per division). The distance t between the interdigital transducer 12 and reflectors 20 is 0.500 λ in FIG. 4A, 0.625 λ in FIG. 4B, 0.750 λ in FIG. 4C, 0.875 λ in FIG. 4D, and λ in FIG. 4E, where λ is the wavelength of the surface acoustic wave excited by the resonator.

These SAW resonators are formed on a 36° rotated Y-cut LiTaO$_3$ substrate. In each case the interdigital transducer 12 comprises aluminum, copper, or an aluminum alloy containing a few percent of silicon, and has one hundred twenty pairs of electrode fingers, with an overlap length or aperture of 100 μm and a static capacitance of 4×10$^2$ pF per unit length per electrode-finger pair. This gives a static capacitance $C_0$ of 4.80 pF, calculated from the following formula.

$C_0$=(number of pairs)×(overlap length)×(static capacitance per unit length per pair)

Markers Mx to Mz are attached to the poles of attenuation and the spurious components in each transfer characteristic. Marker Mx indicates the pole of attenuation due to the antiresonant frequency of the SAW resonator. Marker My indicates a spurious component due to the surface-skimming bulk wave. Marker Mz indicates a spurious component due to the spacing between the interdigital transducer 12 and reflectors 20.

Figure 4A:
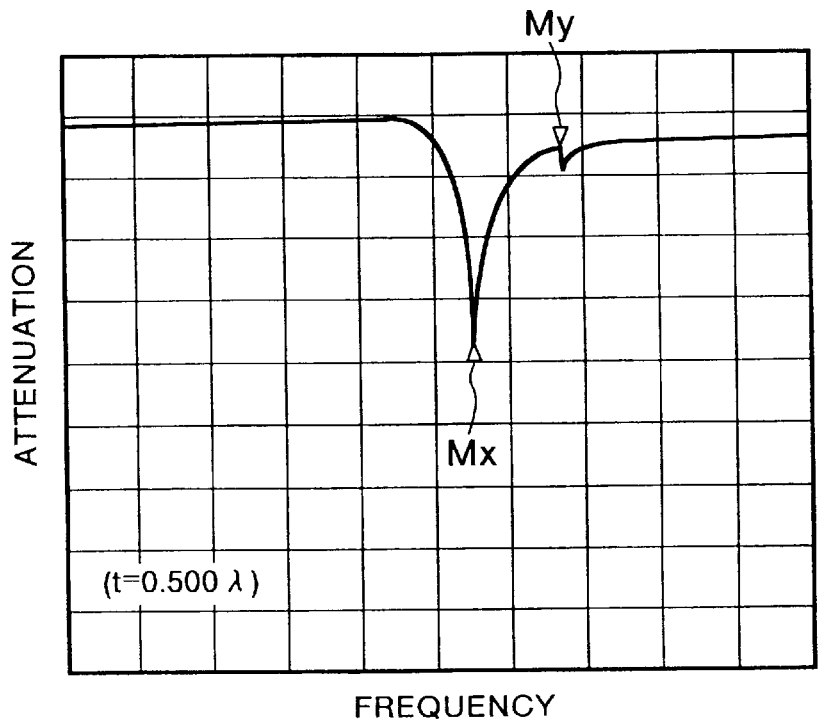
FIGS. 4A, 4B, 4C, 4D, and 4E show transfer characteristics of SAW resonators with various distances between the interdigital transducer and reflectors.
Figure 4B:
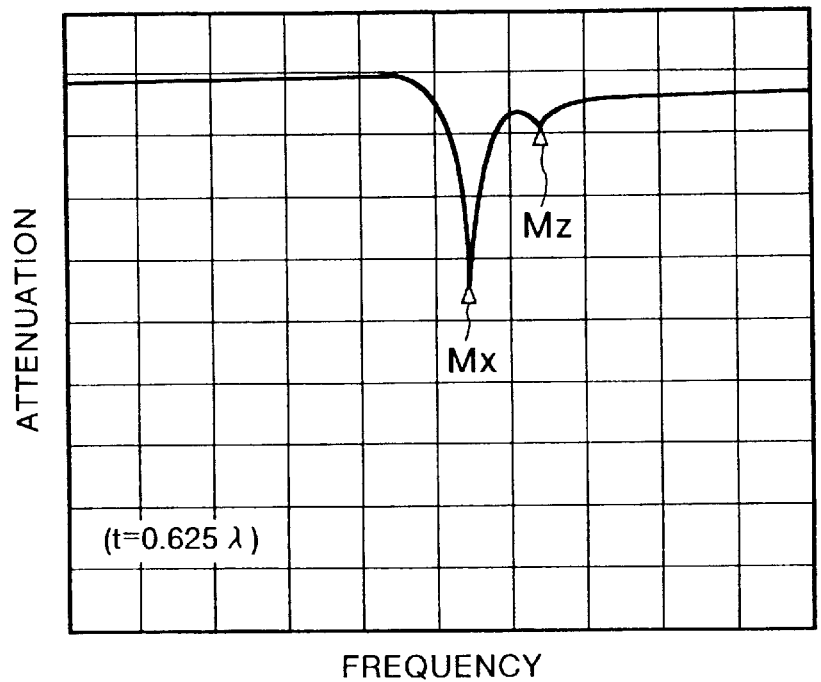
Figure 4C:
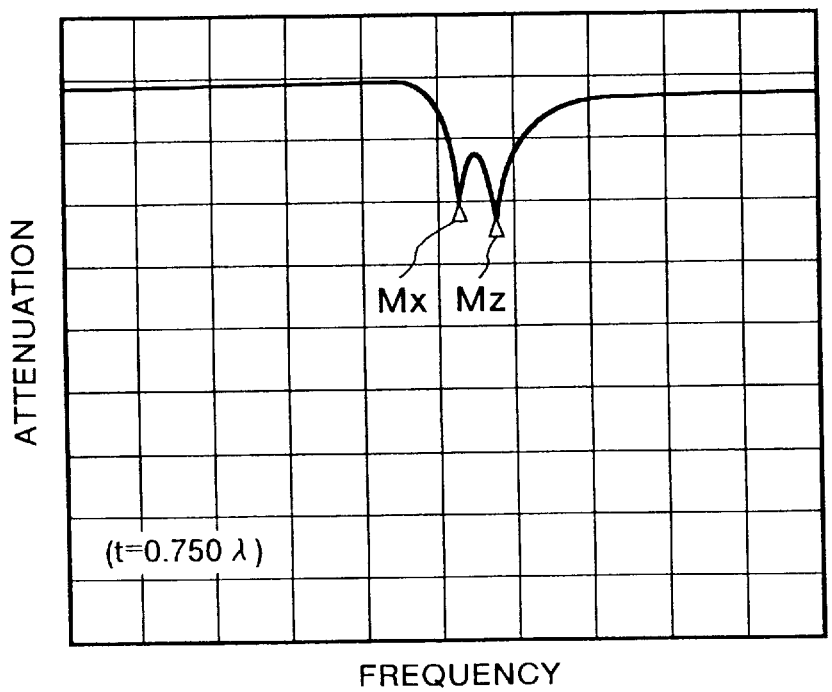

FIG. 4A (t=0.500 λ) shows a narrow spurious component at marker My due to the surface-skimming bulk wave. In FIG. 4B (t=0.625 λ), this spurious component is replaced by a broader spurious component at marker Mz, ascribable to the altered distance t. This new spurious component (marker Mz) moves down in frequency toward marker Mx in FIG. 4C (t=0.750 λ), crosses over to the low-frequency side of marker Mx in FIG. 4D (t=0.825 λ), then disappears in FIG. 4E (t=λ), at which point the spurious SSBW component reappears (marker My).

When disposed in an appropriate position, the new spurious component at marker Mz can act as a pole of attenuation, improving the attenuation characteristic in the upper stopband of the resonator-type SAW filter. An appropriate position is one that is located above marker Mx, neither too close nor too far away. The range of values of the distance t giving appropriate positions for an 800-MHz-band SAW filter with a 25-MHz passband can be estimated as follows.

Under specifications set forth in general standards, an upper stopband of 25 MHz is needed in this type of filter. If the frequency difference between marker Mx and the position of the spurious component at marker Mz is Δf, then it is reasonable to assume that Δf should have a value in the range from 5 MHz to 25 MHz. From FIGS. 4B and 4C, Δf is 20 MHz when the distance t is 0.625 λ, and 10 MHz when the distance t is 0.750 λ. The rate of change of Δf with respect to the distance t in this range is:

(20−10)/[(0.625−0.750)λ]=−8 MHz/(0.1λ)

Figure 4D:
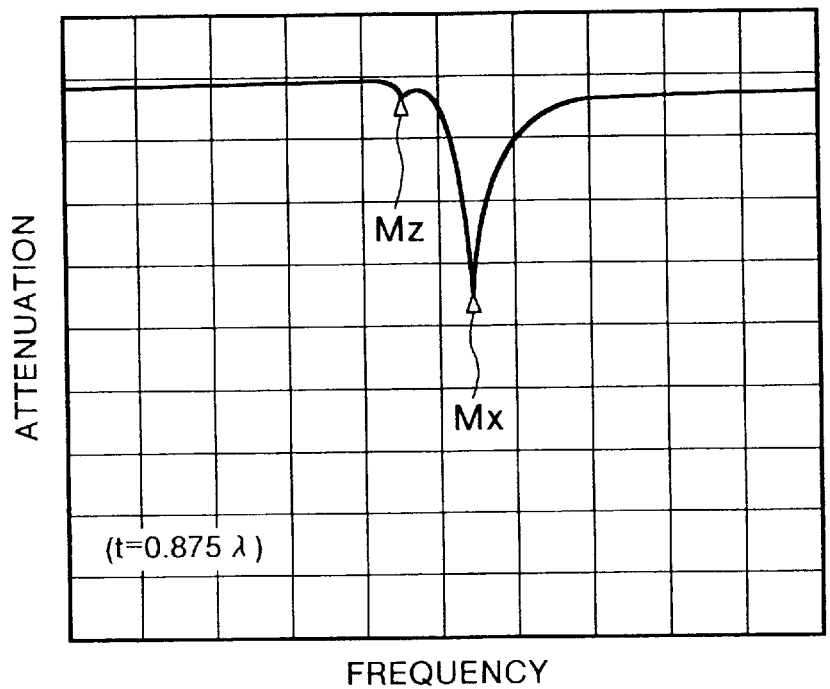

From FIG. 4D, the rate of change becomes steeper above this range, so it is reasonable to assume that the rate of change of Δf around t=0.750 λ is larger than the rate of change of Δf around t=0.625 λ. A reasonable estimate is that the rate of change of Δf in the vicinity of t=0.625 λ is about −8 MHz/0.1λ, and the rate of change of Δf in the vicinity of t=0.750 λ is about −10 MHz/0.1 λ. The distance t that places Δf at 25 MHz can then be estimated as follows:

0.625λ−(25−20)×0.1÷8=(0.625−0.0625)×λ≈0.56λ

The distance t that places Δf at 5 MHz can be similarly estimated as follows:

0.750λ−(5−10)×0.1λ÷10=(0.750+0.050)×λ≈0.80λ

If a margin of 0.1 λ is added to allow for experimental error, the range of values of t that give appropriate values of Δf is from 0.55 λ to 0.81 λ.

Figure 4E:
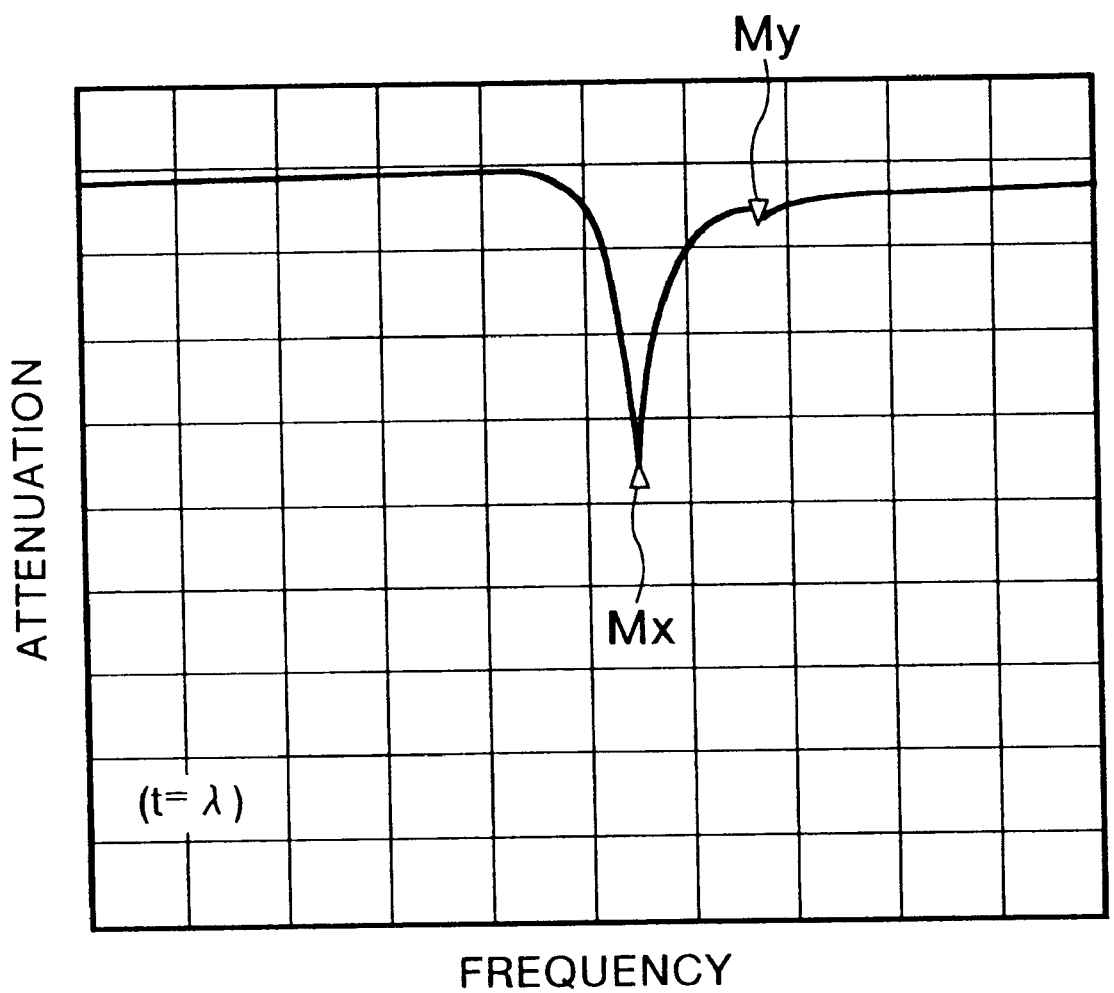

The transfer characteristic is a periodic function of the distance t, with a repeating period of λ/2, as can be seen from the similarity of FIGS. 4A and 4E. The range of values of t that give appropriate values of Δf also repeats periodically: Δf is appropriate when the distance t is in the range from (N/2+0.55)λ$_1$ to (N/2+0.81)λ$_1$, where N is zero or any positive integer. If N is a positive integer, however, the enlarged distance t between the interdigital transducer 12 and reflectors 20 may allow part of the surface acoustic wave to escape, so to confine the surface acoustic wave in the SAW resonator and reduce transfer loss, it is preferable for N to be zero.

First Embodiment

Figure 5:
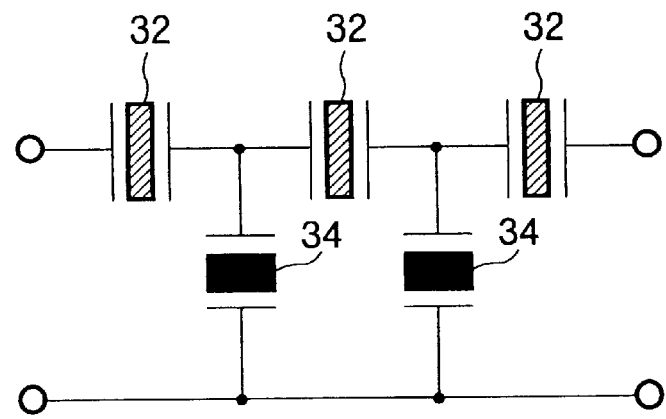
FIG. 5 is an electrical equivalent circuit diagram of a first embodiment of the invention.

As an embodiment of the first aspect of the invention, FIG. 5 shows the equivalent circuit of a four-stage resonator-type SAW filter with a T-type configuration. The distance t between the interdigital transducer and reflectors in the three series-arm SAW resonators 32 is identically 17 λ$_1$/24 (0.708 λ$_1$), satisfying condition A. The distance t in the two shunt-arm SAW resonators 34 is 0.5 λ$_2$. The series-arm SAW resonators 32 have a static capacitance of 4.84 pF. The shunt-arm SAW resonators 34 have a static capacitance of 1.96 pF.

Figure 6:
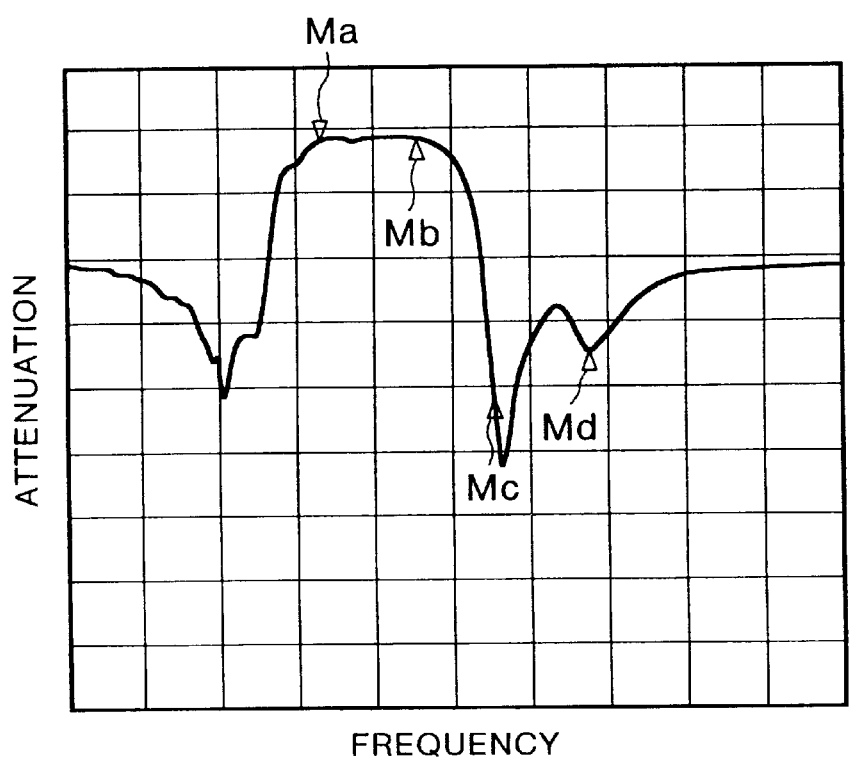
FIG. 6 illustrates the transfer characteristic of the first embodiment.

FIG. 6 shows experimental measurements of the transfer characteristic of this embodiment. The horizontal and vertical axes indicate frequency and attenuation as in FIGS. 4A to 4E. The interval between markers Ma and Mb is the passband, and the interval between markers Mc and Md is the upper stopband. Each division on the horizontal axis represents 20 MHz, and each division on the vertical axis represents 10 dB.

Figure 7:
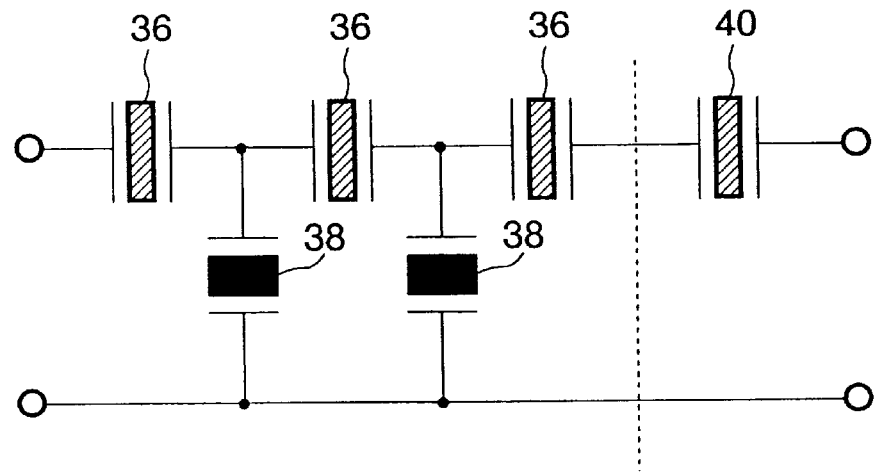
FIG. 7 is an electrical equivalent circuit diagram of a prior-art resonator-type SAW filter.

For comparison, FIG. 7 illustrates a prior-art filter having three identical series-arm SAW resonators 36 in which the distance t is λ$_1$/2, two shunt-arm SAW resonators 38 in which the distance t is λ$_2$/2, and an additional SAW resonator 40, coupled in series with the series-arm SAW resonators 36, to improve the attenuation characteristic of the upper stopband. This is not, strictly speaking, a ladder filter; only the part to the left of the dotted line has a ladder configuration. The distance t in the additional SAW resonator 40 is $\lambda_3/2$, where $\lambda_3$ is the wavelength of the surface acoustic wave excited by the SAW resonator 40. The series-arm SAW resonators 36 have a static capacitance of 4.84 pF, the shunt-arm SAW resonators 38 have a static capacitance of 1.96 pF, and the additional SAW resonator 40 has a static capacitance of 5.76 pF.

Figure 8:
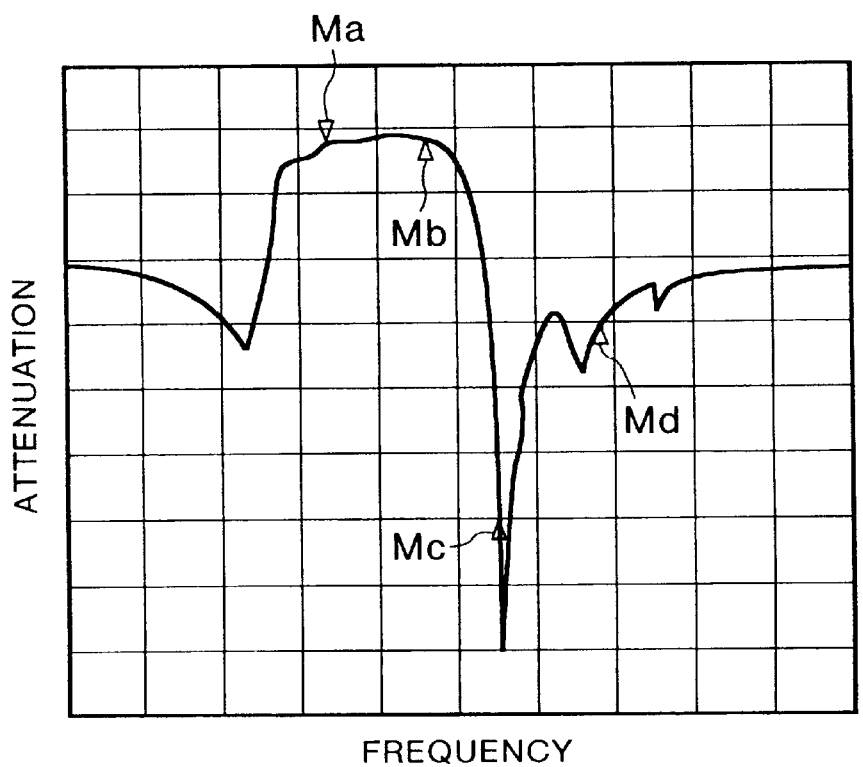
FIG. 8 illustrates the transfer characteristic of the filter in FIG. 7.

FIG. 8 shows the transfer characteristic of the prior-art filter in FIG. 7, using the same horizontal and vertical scales and markers as in FIG. 6. Table 1 indicates the attenuation at markers Ma to Md in the characteristics in FIGS. 6 and 8.

TABLE 1

|   | Marker Ma Attenuation (dB) | Marker Mb Attenuation (dB) | Marker Mc Attenuation (dB) | Marker Md Attenuation (dB) |
|---|---|---|---|---|
| 1 | −2.03 | −1.50 | −41.12 | −33.64 |
| 0 | −2.81 | −2.33 | −59.63 | −30.62 |

1: First embodiment (FIG. 6)
0: Prior art (FIG. 8)

A comparison of the characteristics in FIGS. 6 and 8 shows generally similar attenuation characteristics in the upper stopband between marker Mc and marker Md. The first embodiment, that is, achieves an attenuation improvement in the upper stopband similar to that in the prior art, without requiring an additional SAW resonator. The physical size of the filter can be reduced accordingly, as compared with the prior art.

In addition, as a comparison of the two characteristics in the vicinity of marker Ma shows, the first embodiment has smaller insertion loss in the passband than does the prior art. This also is due to the absence of an additional SAW resonator.

Many other embodiments of the first aspect of the invention are of course possible. The number of series-arm SAW resonators in the filter may be any number equal to or greater than one. When there is only one series-arm SAW resonator it must, of course, satisfy condition A. When there are two or more series-arm SAW resonators, it is only necessary for one of them to satisfy condition A to produce a pole of attenuation improving the upper stopband characteristic, but it is generally desirable for more than one to satisfy condition A. In particular, two or more series-arm SAW resonators satisfying condition A with different values of t can provide the greatest improvement in the upper stopband characteristic, as multiple poles of attenuation can be obtained in different locations.

Second Aspect of the Invention

Although the first aspect of the invention yields a fully serviceable filter, there is still room for improvement in regard to the passband ripple characteristics of the filter. A filter configured according to the first aspect of the invention with multiple series-arm SAW resonators, for example, tends to have a transfer characteristics like that depicted in FIG. 9, which shows frequency on the horizontal axis and attenuation on the vertical axis in arbitrary units. The passband 42 is not flat, but exhibits a ripple RL at the low-frequency end and a ripple RH at the high-frequency end. A prominent ripple R also tends to appear above the upper stopband 44. Ripple RL arises from harmonic modes of the shunt-arm SAW resonators 8, ripple RH arises from harmonic modes of the series-arm SAW resonators 2, and ripple R arises from the surface-skimming bulk wave of the series-arm SAW resonators 2.

Figure 9:
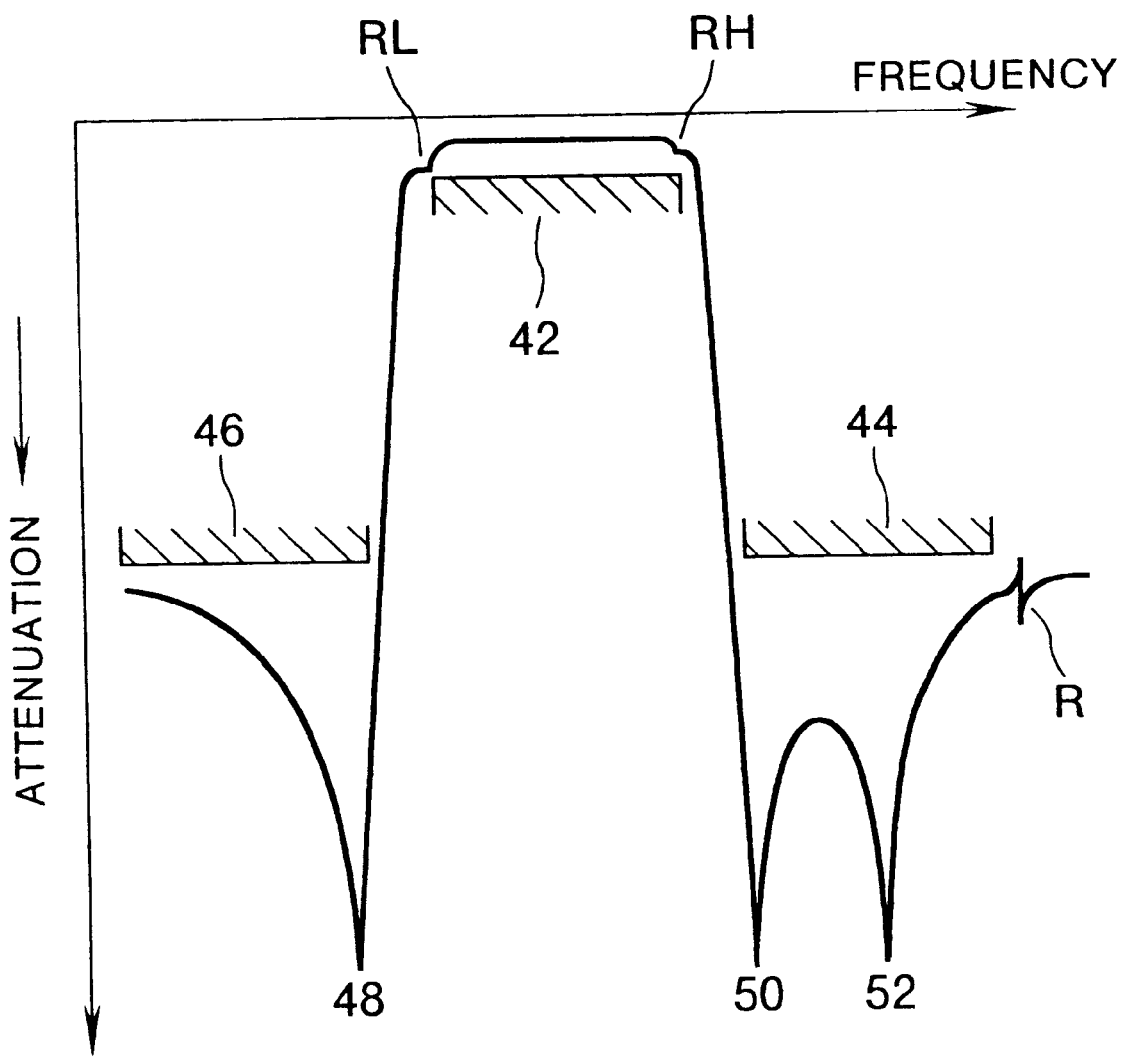
FIG. 9 illustrates the transfer characteristic of a resonator-type SAW filter according to the first aspect of the invention, showing passband ripple.

Other features shown in FIG. 9, incidentally, are the lower stopband 46, the attenuation pole 48 due to the resonant frequency of the shunt-arm SAW resonators 8, the attenuation pole 50 due to the antiresonant frequency of the series-arm SAW resonators 2, and the spurious component 52 created by a series-arm SAW resonator satisfying condition A. Ripple arising from the surface-skimming bulk wave in the shunt-arm SAW resonators 8 is present in the neighborhood of attenuation pole 50, but is omitted for simplification.

The two ripples RL and RH at the ends of the passband 42 are both undesirable, but the ripple RL at the lower end, caused by harmonic modes of the shunt-arm SAW resonators, tends to be the larger of the two. Thus the insertion loss is greater at the low end of the passband 42 than at the high end. The second aspect of the invention will be applied below first to reduce the low-end ripple RL, then to reduce the high-end ripple RH.

The ripple R is not a cause for concern, as it occurs above the upper stopband.

Second Aspect Applied to Shunt-arm SAW Resonators

Figure 10:
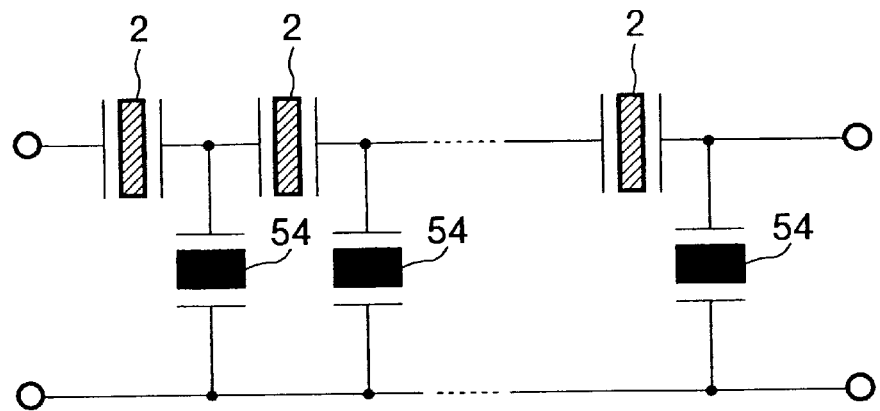
FIG. 10 is an electrical equivalent circuit diagram of a resonator-type SAW filter in which the second aspect of the invention is applied to the shunt-arm SAW resonators.

Referring to FIG. 10, the second aspect of the invention can be applied to the shunt-arm SAW resonators 54 of a resonator-type SAW filter in which at least one of the series-arm SAW resonators 2 satisfies the above condition A (and in any series-arm SAW resonators not satisfying condition A, the distance t between the interdigital transducer and reflectors is the conventional $\lambda_1/2$). When the second aspect of the invention is applied in this way, at least half of the electrode fingers are apodized in the interdigital transducers of all of the shunt-arm SAW resonators 54.

Figure 11:
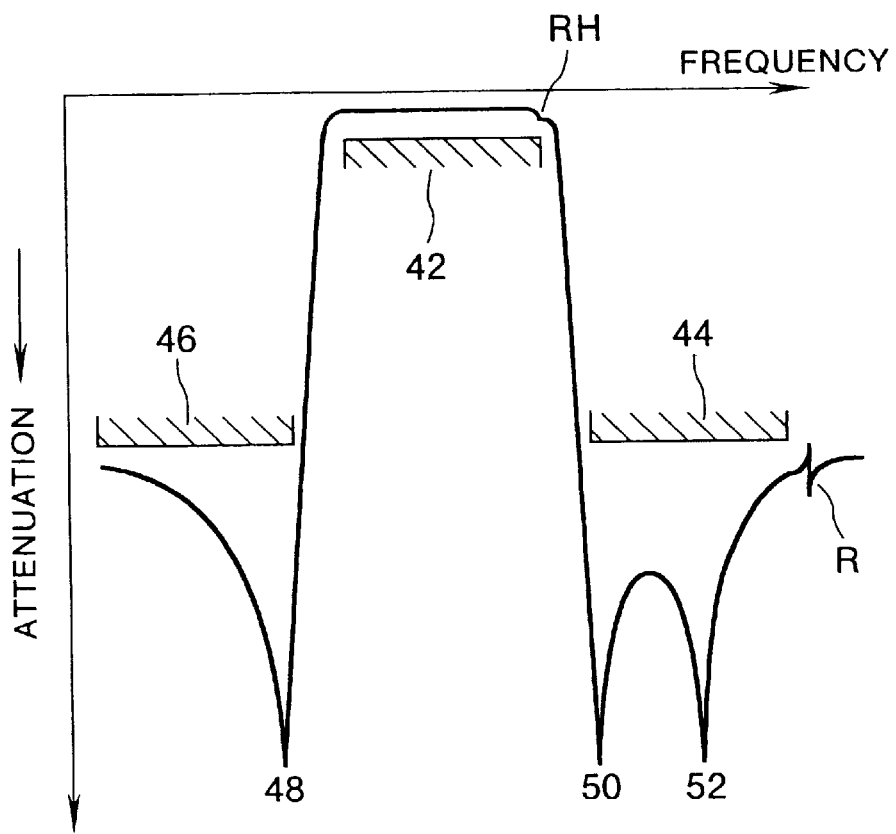
FIG. 11 illustrates the improvement in the transfer characteristic obtained from the filter in FIG. 10.

FIG. 11 illustrates the effect of this apodization on the transfer characteristic. The vertical and horizontal axes and reference numerals are the same as in FIG. 9. A comparison with FIG. 9 shows that the ripple RL at the lower end of the passband 42 has been substantially eliminated.

Figure 12A:
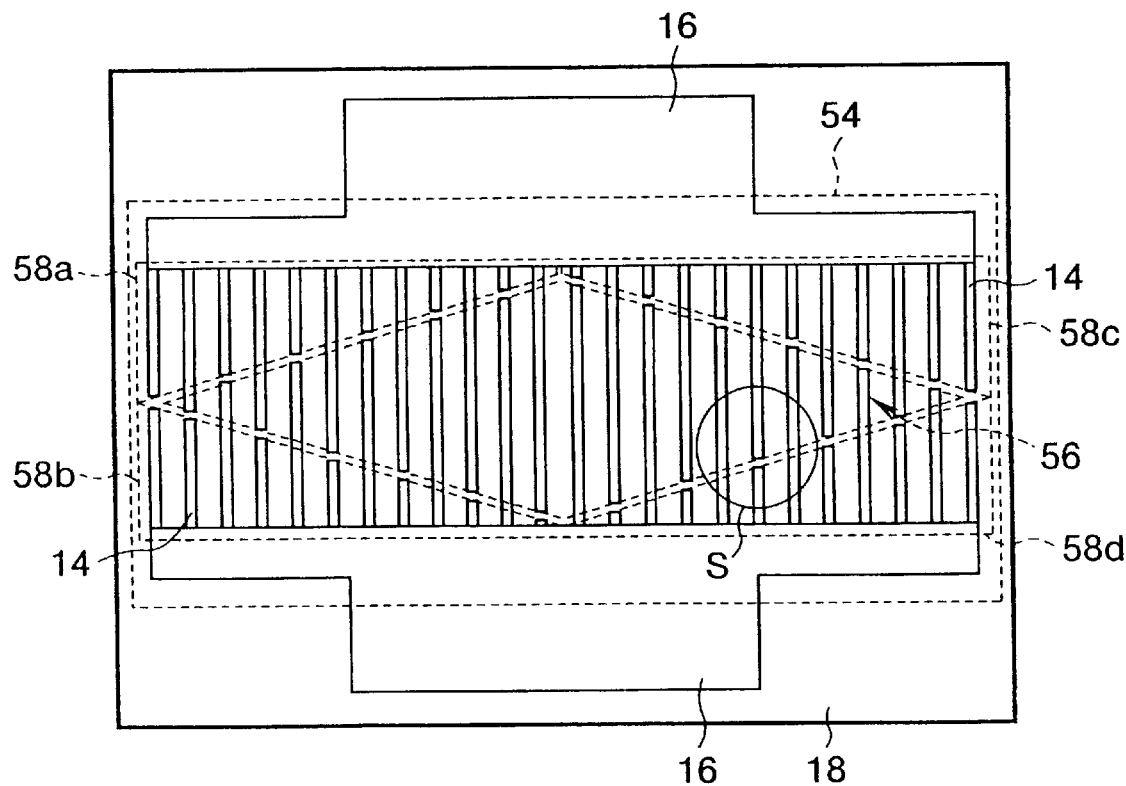
FIG. 12A illustrates 100% apodization of a shunt-arm SAW resonator.

FIG. 12A shows an example in which all the electrode fingers 14 in a shunt-arm SAW resonator 54 are apodized. The apodization pattern is diamond-shaped, so that the overlap length increases linearly from both ends of the interdigital transducer toward the center. The region enclosed by the apodizing locus is the SAW excitation region 56. The regions enclosed by the right-triangular dotted lines are dummy regions 58a, 58b, 58c, and 58d, which function in the same way as reflectors.

Figure 12B:
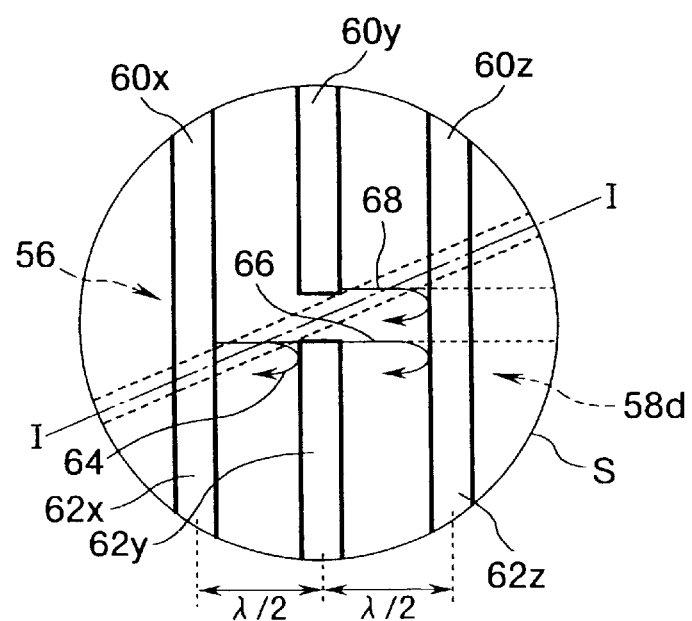
FIG. 12B is an enlargement of area S in FIG. 12A.

FIG. 12B is an enlargement of the circular area S in FIG. 12A. The electrode-finger portions 60x, 60y, and 60z above line I—I in FIG. 12B lie within the SAW excitation region 56, while the electrode-finger portions 62x, 62y, and 62z below line I—I lie in dummy region 58d. The surface acoustic waves 64 and 66 excited by electrode-finger portion 60x are partially reflected by the electrode-finger portion 62y at a position $\lambda_2/2$ distant from electrode-finger portion 60x and partially reflected by the electrode-finger portion 62z at a position $\lambda_2/2$ distant from electrode-finger portion 60y, with additional partial reflections being caused by more distant electrode-finger portions disposed further to the right. Altogether, the surface acoustic wave excited by electrode-finger portion 60x is reflected by electrode-finger portions in positions distant by $n\lambda_2/2$ (n=1, 2, . . . ) from electrode-finger portion 60x.

Similarly, the surface acoustic wave 68 excited by electrode-finger portion 60y is reflected by electrode-finger portions 62z, . . . in positions distant by $n\lambda_2/2$ (n=1, 2, . . . ) from electrode-finger portion 60y. The electrode-finger portions in the dummy regions created by apodization thus act as reflectors within the interdigital transducer, reducing the leakage of surface-acoustic-wave energy from the edges of the interdigital transducer to the outside. With the 100% apodization shown in FIG. 12A, reflection within the dummy regions 58a, 58b, 58c, and 58d may be sufficient to render the reflectors 20 shown in FIG. 2B unnecessary, in which case the reflectors can be omitted and the size of the filter can be reduced accordingly. Even when fewer than 100% of the electrode fingers 14 are apodized, the reflectors 20 may become unnecessary.

Figure 13:
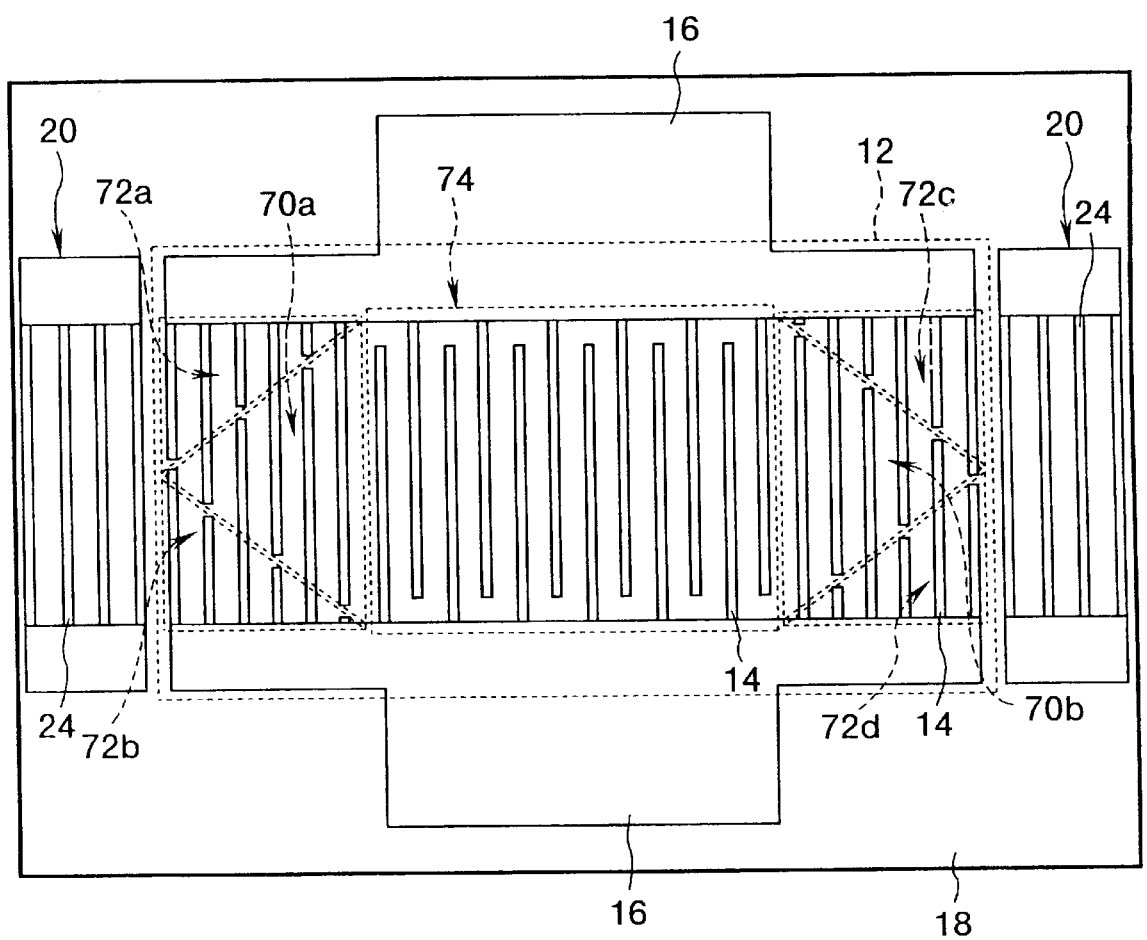
FIG. 13 illustrates 50% apodization of a shunt-arm SAW resonator.

FIG. 13 shows a shunt-arm SAW resonator in which just half of the electrode fingers 14 are apodized. As is customary in this case, one-fourth of the electrode fingers 14 are apodized at each end of the interdigital transducer 12. The apodization creates two SAW excitation regions 70a and 70b having substantially equilateral triangular shapes, and four dummy regions 72a, 72b, 72c, and 72d having right-triangular shapes. The rectangular non-apodized electrode-finger region 74 is also a SAW excitation region. The dummy regions 72a, 72b, 72c, and 72d again function as reflectors, but since only half of the electrode fingers 14 are apodized, the dummy regions are narrower than in FIG. 12A, and reflection is less complete. Additional reflectors 20 are accordingly provided at a distance of $\lambda_2/2$ from both ends of the interdigital transducer 12. These reflectors 20 can be smaller than in FIG. 2B, about fifty metal fingers 24 sufficing in each reflector 20, so the size of the filter can again be reduced.

The reason for apodizing at least half of the electrode fingers 14 is explained in FIGS. 14A, 15A, 16A, 17A, and 18A, which show transfer characteristics of five SAW resonators with various degrees of apodization, and in FIGS. 14B, 15B, 16B, 17B, and 18B, which show reflection characteristics of these SAW resonators in the form of Smith charts. The degree of apodization is 0% (no apodization) in FIGS. 14A and 14B, 33% in FIGS. 15A and 15B, 50% in FIGS. 16A and 16B, 83% in FIGS. 17A and 17B, and 100% in FIGS. 18A and 18B. Linear apodization patterns are employed, similar to those in FIGS. 12 and 13.

Figure 14A:
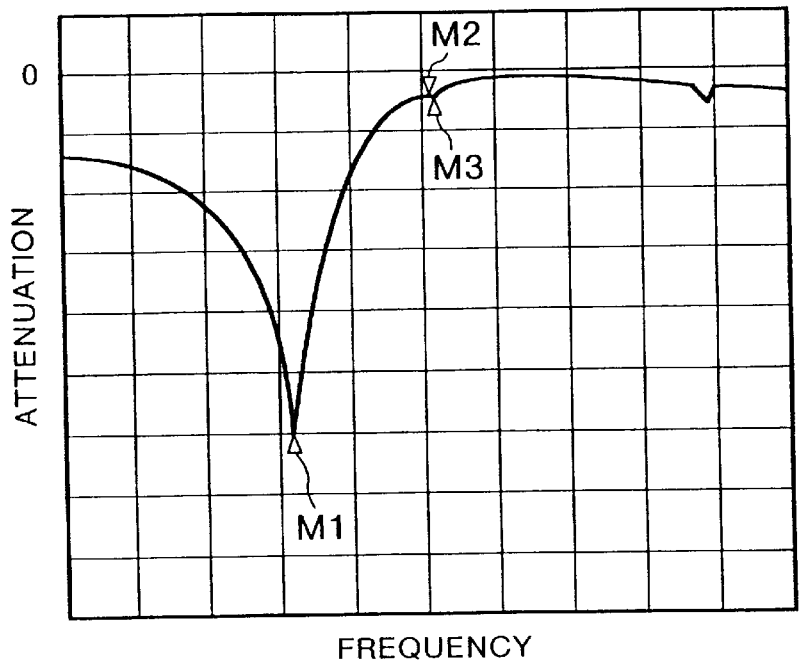
FIGS. 14A, 15A, 16A, 17A, and 18A illustrate transfer characteristics of shunt-coupled SAW resonators with various levels of apodization.
Figure 14B:
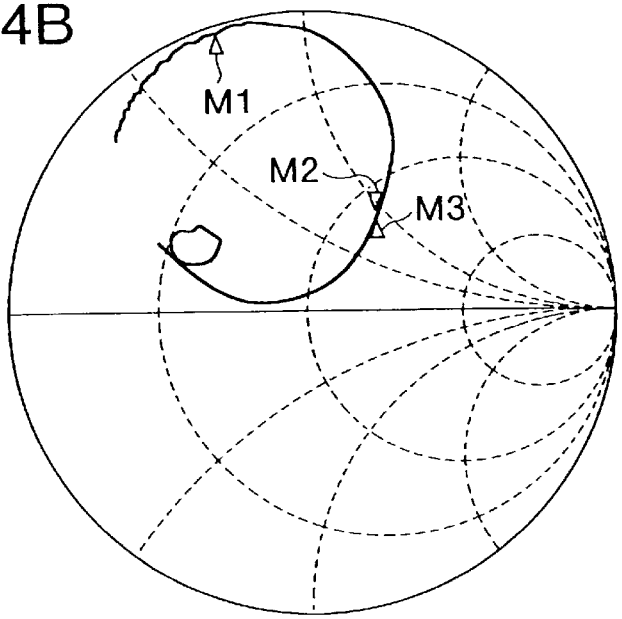
FIGS. 14B, 15B, 16B, 17B, and 18B illustrate reflection characteristics of shunt-coupled SAW resonators with various levels of apodization.
Figure 14C:
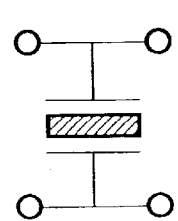
FIG. 14C illustrates the coupling of the SAW resonators in FIGS. 14A to 18B.
Figure 15A:
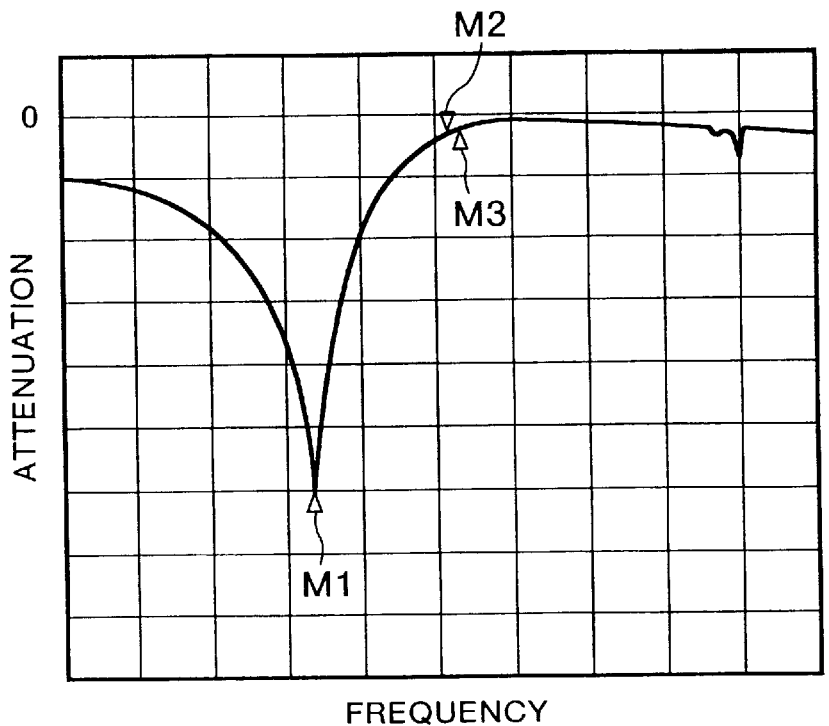
Figure 15B:
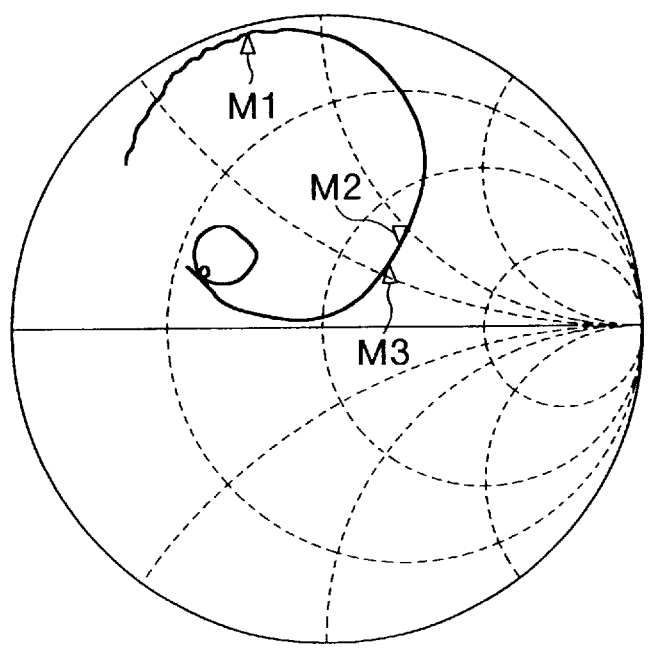
Figure 16A:
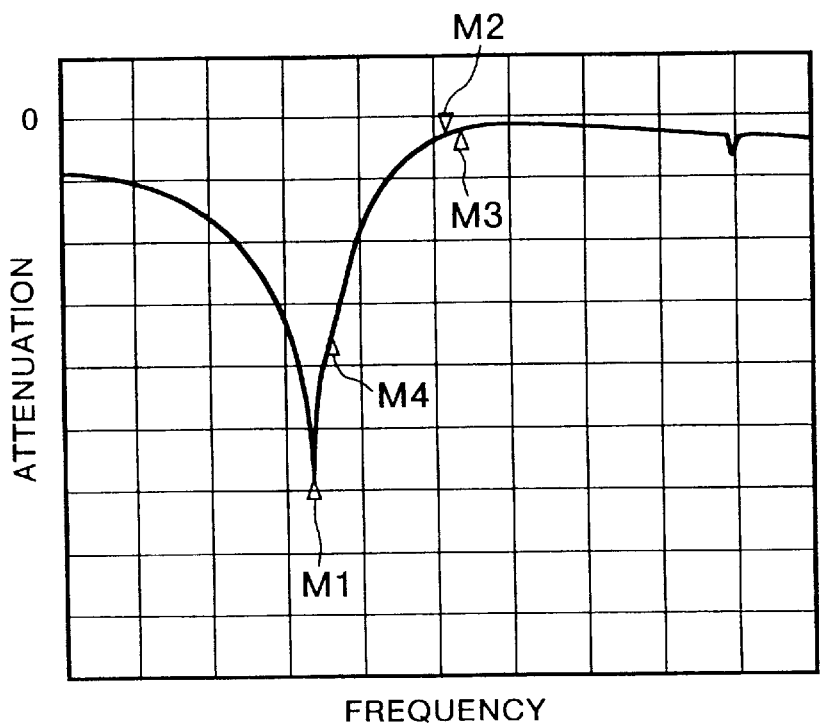
Figure 16B:
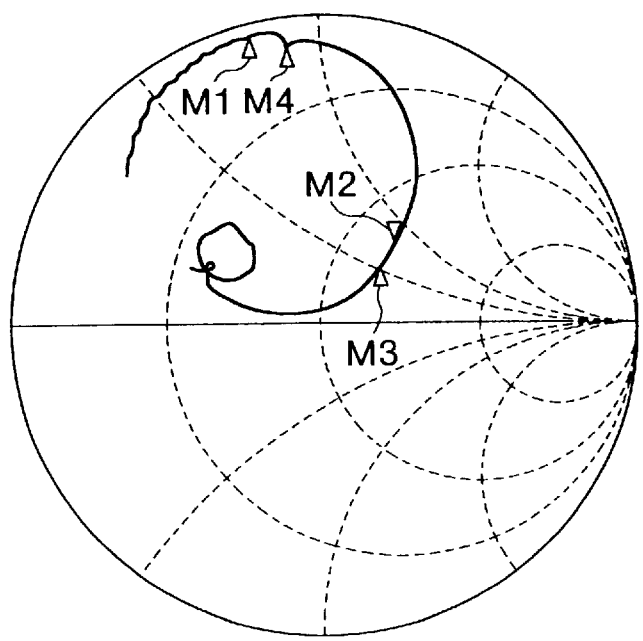
Figure 17A:
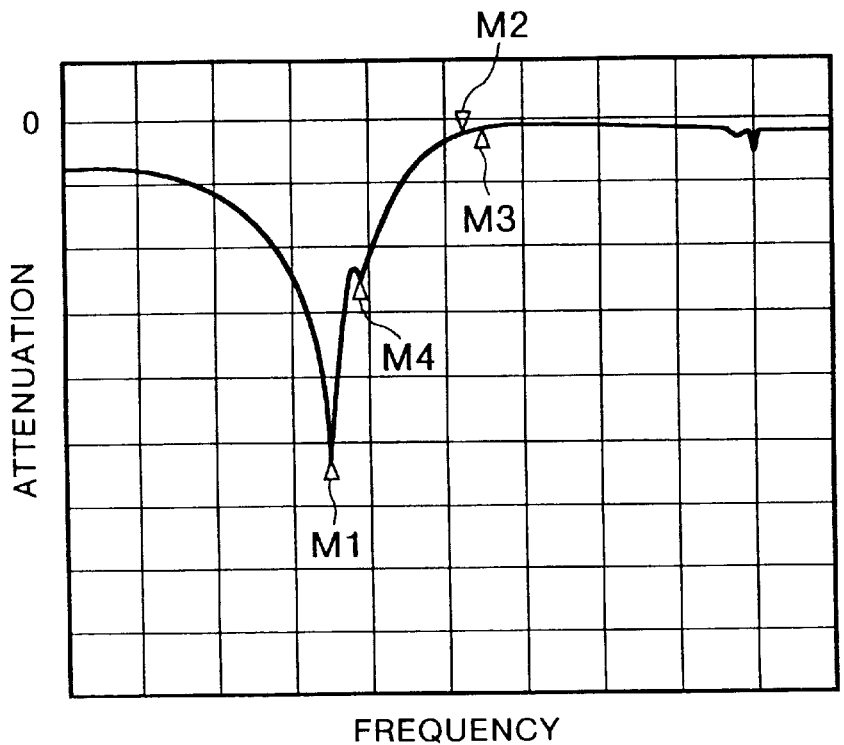
Figure 17B:
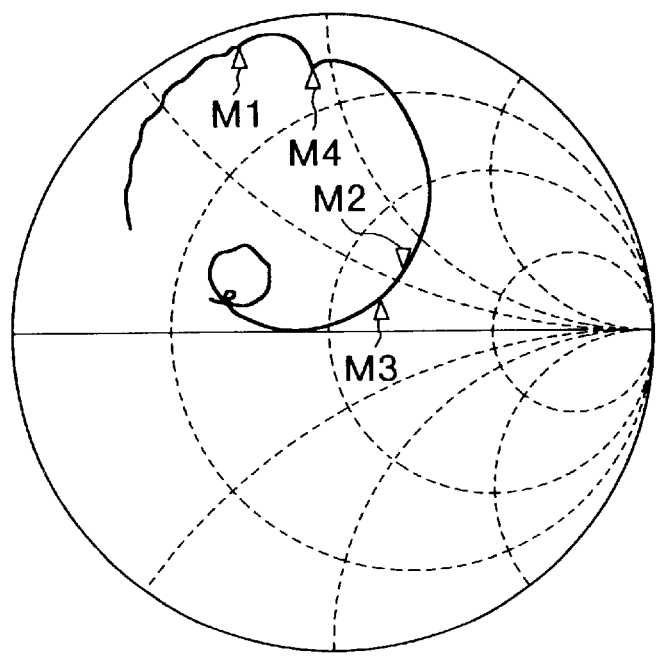
Figure 18A:
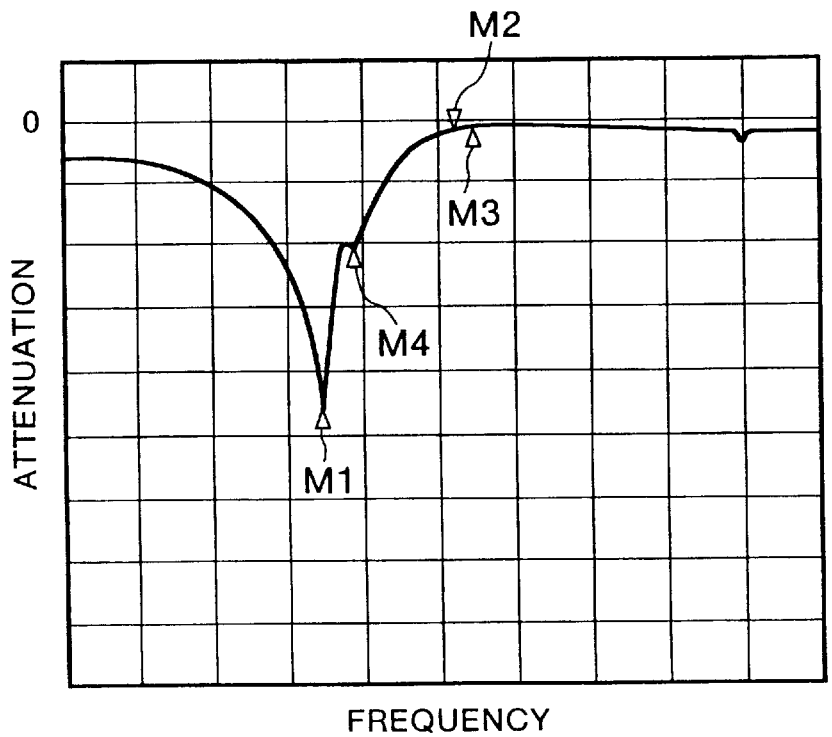
Figure 18B:
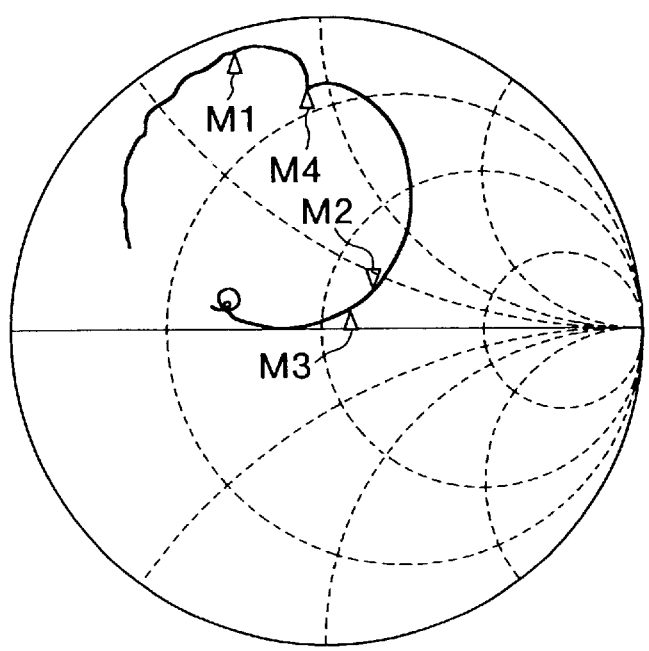

In all five SAW resonators, the distance t between the interdigital transducer 12 and reflectors 20 is $\lambda/2$, as in FIG. 2B and FIG. 13. Each SAW resonator is coupled in the shunt configuration shown in FIG. 14C. The interdigital transducer of each SAW resonator comprises aluminum, copper, or an aluminum alloy containing a few percent of silicon. The interdigital transducer has one hundred twenty electrode pairs, formed on a 36° rotated Y-cut LiTaO$_3$ substrate, with a static capacitance of 4×10$^2$ pF per unit length per unit pair, having an overlap length of 100 μm at the center of the interdigital transducer 12, and a static capacitance $C_0$ of 4.80 pF calculated by the formula given previously:

C$_0$=(number of pairs)×(overlap length)×(static capacitance per unit length and unit pair)

Markers M1 to M3 in these drawings are set as follows. Marker M1 indicates the position of the pole of attenuation due to the antiresonant frequency. Marker M2 indicates ripple due to harmonic modes. Marker M3 is located at a frequency position 20 MHz higher than marker M1, at what would be the low-frequency end of the passband of an 800-MHz-band resonator-type SAW filter. Table 2 indicates the attenuation at marker M3 for the five apodization levels.

TABLE 2

|  | 0% | 33% | 50% | 83% | 100% |
|---|---|---|---|---|---|
| M3 | −1.9426 | −1.3006 | −0.9976 | −0.6152 | −0.5201 |

Attenuation (dB)

As the amount of apodization increases, the ripple in the vicinity of marker M2 gradually disappears. This can be seen most clearly in the reflection characteristics, e.g. by comparing FIGS. 14B and 18B. In addition, the loss at marker M3 decreases from −1.9426 dB with no apodization to −0.5201 dB with 100% apodization, as indicated by Table 2. At the 50% apodization level (FIGS. 16A and 16B), the effect of apodization is already quite evident: the ripple at marker M2 is largely eliminated and the loss at marker M3 is reduced to −0.9976 dB.

At apodization levels from 50% to 100%, other harmonic modes occur, causing spurious effects at the position of marker M4 in FIGS. 16A, 16B, 17A, 17B, 18A, and 18B. These spurious effects lie outside the passband, below the frequency indicated by marker M3, so they have substantially no effect on the passband attenuation characteristic. Thus if at least half of the electrode fingers in the shunt-arm SAW resonators are apodized, the ripple RL at the low-frequency end of the passband can be substantially eliminated, without harmful side effects.

Second and Third Embodiments

Figure 19A:
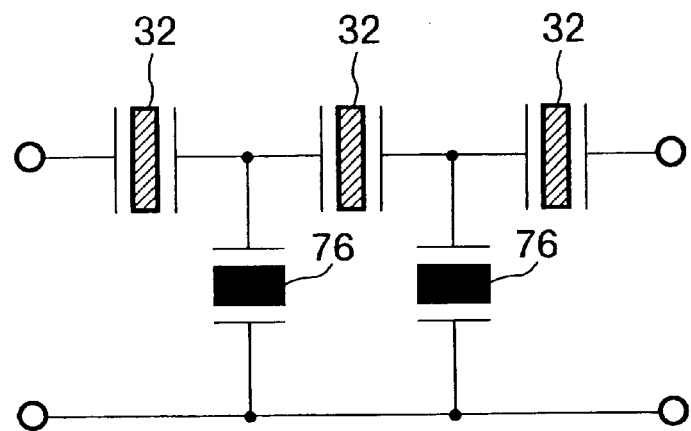
FIG. 19A is an electrical equivalent circuit diagram of a second embodiment of the invention.

As a second embodiment, illustrating both aspects of the invention, FIG. 19A shows an electrical equivalent circuit of a four-stage resonator-type SAW filter with a T-type ladder configuration, in which the distance t between the interdigital transducer and reflectors is 17 $\lambda_1/24$ (0.708 $\lambda_1$) in all of the series-arm SAW resonators 32, as in the first embodiment; the distance t is $\lambda_2/2$ in both of the shunt-arm SAW resonators 76; and the interdigital transducers of both of the shunt-arm SAW resonators 76 are 100% apodized with a linear apodization pattern, as in FIG. 12A. The series-arm SAW resonators 32 have a static capacitance of 4.84 pF, while the shunt-arm SAW resonators 76 have a static capacitance of 1.96 pF.

Figure 19B:
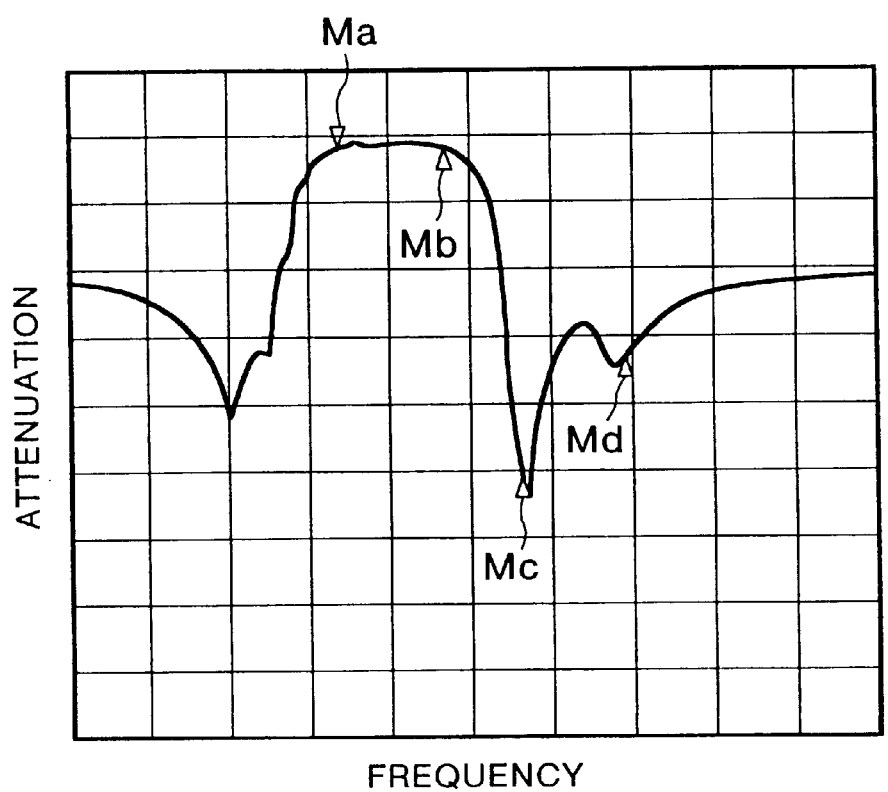
FIG. 19B illustrates the transfer characteristic of the second embodiment.

FIG. 19B shows the transfer characteristic of this filter. Markers Ma and Mb indicate the passband, while markers Mc and Md indicate the upper stopband. Each division on the horizontal (frequency) axis represents 20 MHz, and each division on the vertical (attenuation) axis represents 10 dB.

Figure 20A:
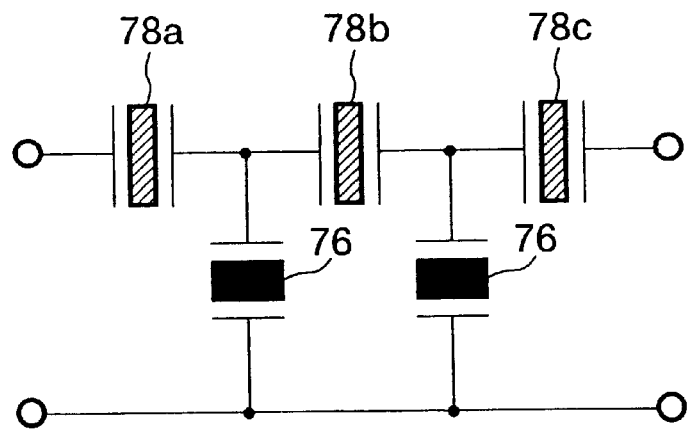
FIG. 20A is an electrical equivalent circuit diagram of a third embodiment of the invention.

As a third embodiment, FIG. 20A shows another four-stage resonator-type SAW filter with a T-type ladder circuit configuration, in which the three series-arm SAW resonators 78a, 78b, and 78c have different values of the distance t between the interdigital transducer and reflectors. The value of t is 16 $\lambda_1/24$ (0.667 $\lambda_1$) in SAW resonator 78a, 17 $\lambda_1/24$ (0.708 $\lambda_1$) in SAW resonator 78b, and 18 $\lambda_1/24$ (0.750 $\lambda_1$) in SAW resonator 78c. All three series-arm SAW resonators thus satisfy condition A. The two shunt-arm SAW resonators 76 are the same as in the second embodiment, with 100% apodization. The series-arm SAW resonators 78a, 78b, and 78c have a static capacitance of 4.84 pF, while the shunt-arm SAW resonators 76 have a static capacitance of 1.96 pF.

Figure 20B:
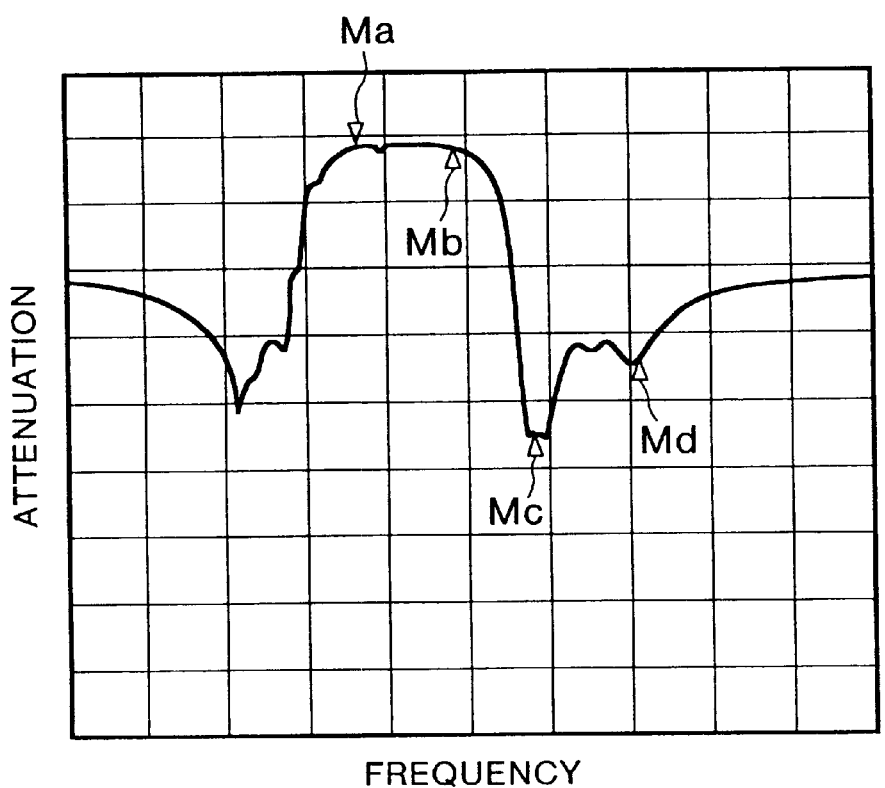
FIG. 20B illustrates the transfer characteristic of the third embodiment.

FIG. 20B shows the transfer characteristic of the third embodiment, with the same horizontal scales and markers as in FIG. 19B. Table 3 indicates the attenuation at markers Ma to Md in the transfer characteristics in FIG. 19B and FIG. 20B.

TABLE 3

|  | Marker Ma Attenuation (dB) | Marker Mb Attenuation (dB) | Marker Mc Attenuation (dB) | Marker Md Attenuation (dB) |
|---|---|---|---|---|
| 2 | −1.97 | −2.02 | −50.37 | −33.17 |
| 3 | −2.03. | −1.84 | −44.72 | −33.58 |

2: Second embodiment
3: Third embodiment

Tables 1 and 3 indicate that apodization of the shunt-arm SAW resonators has improved the flatness of the passband.

The difference between the loss at marker Ma and the loss at marker Mb was −0.53 dB in the first embodiment, but is only 0.05 dB in the second embodiment and −0.19 dB in the third embodiment. The improved flatness implies that the ripple RL at the lower end of the passband has been reduced. The calculations are as follows:

In Table 1: −2.03−(−1.50)=−0.53
In Table 3: −1.97−(−2.02)=0.05
−2.03−(−1.84)=−0.19

While the reduction in ripple RL is not immediately evident from visual inspection of the characteristics in FIGS. 6, 19A, and 20A, or from comparison of the losses at marker A in Tables 1 and 3, this is to be expected from effects such as variations in fabrication conditions. The conclusion that the flatness of the passband characteristic is improved by apodization of the shunt-arm SAW resonators remains valid.

In the third embodiment, the flatness of the upper stopband characteristic between markers Mc and Md is also improved, as can be seen by comparing FIG. 20B with FIGS. 6 and 19B. This is because the three different values of the distance t in the series-arm SAW resonators 78a, 78b, and 78c in the third embodiment produce more poles of attenuation affecting the upper stopband.

Second Aspect Applied to SAW Resonators in Both Arms

Figure 21A:
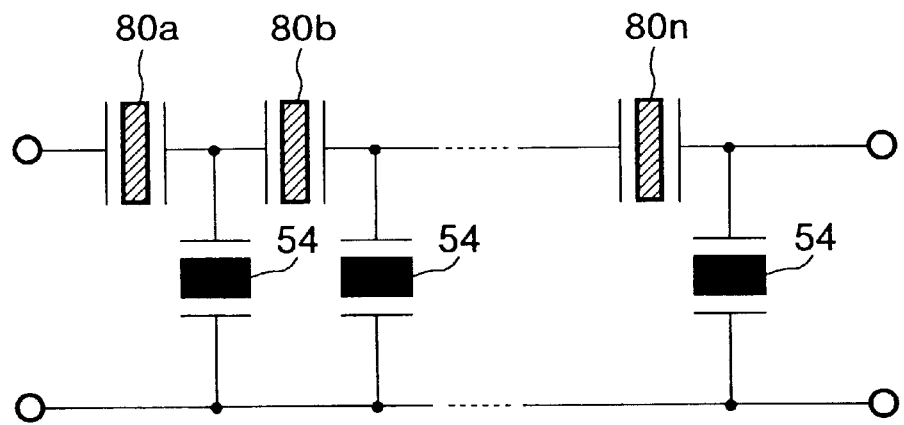
FIG. 21A is an electrical equivalent circuit diagram of a resonator-type SAW filter in which the second aspect of the invention is applied to at least one series-arm SAW resonator, as well as to the shunt-arm SAW resonators.

The second aspect of the invention can be applied to one or more of the series-arm SAW resonators as well as to the shunt-arm SAW resonators, to reduce the ripple RH at the upper end of the passband as well as the ripple RL at the lower end. In FIG. 21A, for example, the invention can be practiced by having the distance t between the interdigital transducer and reflectors in at least one of series-arm SAW resonators 80a, 80b, . . . , 80n satisfy the above condition A, and by also apodizing from 30% to 80% of the electrode fingers in at least one of these series-arm SAW resonators 80a, 80b, . . . , 80n, the apodized series-arm SAW resonators being different from the series-arm SAW resonators that satisfy condition A. It is also possible to apodize one or more of the series-arm SAW resonators according to a condition B, described below, that produces the same effect as condition A, in which case the invention can be practiced without having any series-arm SAW resonators satisfy condition A. If any series-arm SAW resonator does not satisfy condition A, it has the normal value of t ($t=\lambda_1/2$).

The shunt-arm SAW resonators 54 in FIG. 21A are like those in FIG. 10, with at least half of the electrode fingers in each shunt-arm SAW resonator apodized. The invention can also be practiced, however, with apodization of only series-arm SAW resonators, if there is a need to reduce the high-frequency passband ripple RH without reducing the low-frequency passband ripple RL.

Figure 21B:
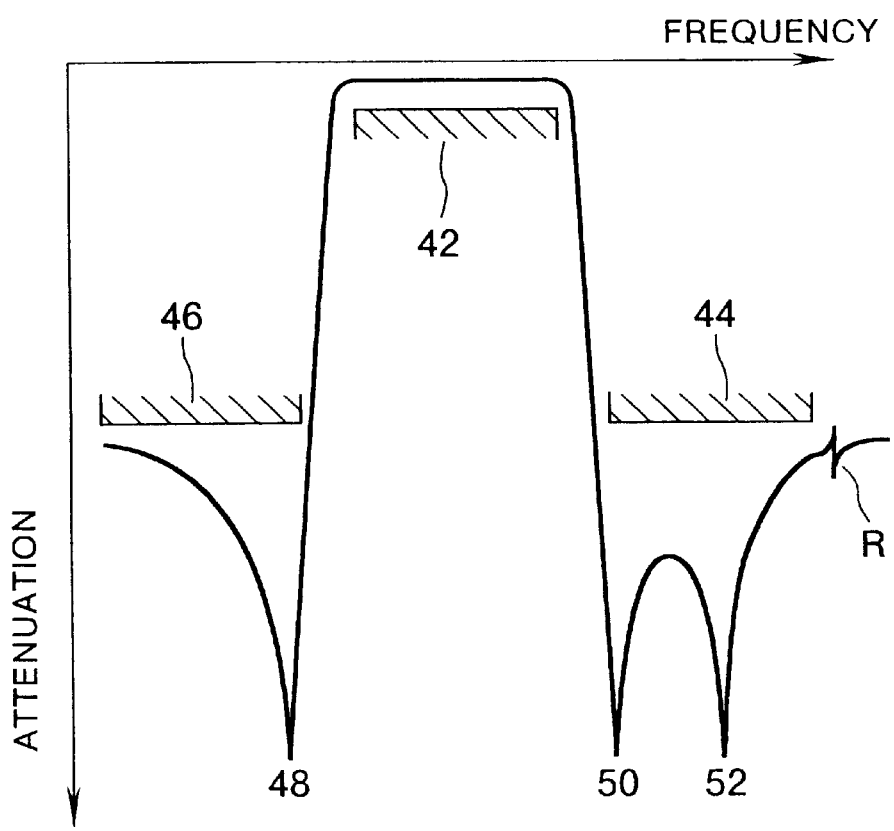
FIG. 21B illustrates the improvement in the transfer characteristic obtained from the filter in FIG. 21A.

FIG. 21B shows the effect on the transfer characteristic of apodizing both the series-arm SAW resonators and shunt-arm SAW resonators. The horizontal axis indicates frequency, and the vertical axis indicates attenuation, as in FIG. 11. All passband ripple is eliminated in FIG. 21B, leaving only the harmless extraneous ripple R above the upper stopband 44. This effect is combined with the effect of the first aspect of the invention in improving the transfer characteristic in the upper stopband 44 by means of the spurious component 52 created by the series-arm SAW resonator or resonators satisfying condition A or condition B.

Figure 22A:
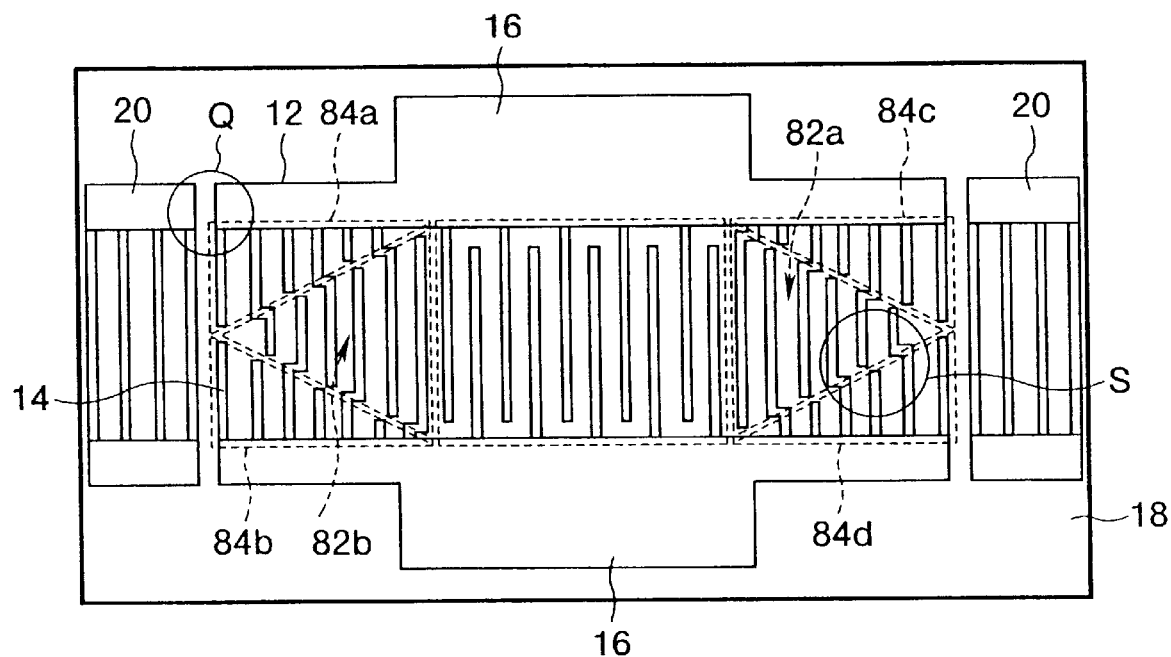
FIG. 22A illustrates an apodized series-arm SAW resonator.
Figure 22B:
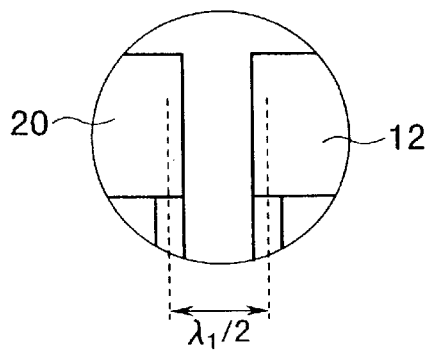
FIG. 22B is an enlargement of area Q in FIG. 22A.
Figure 22C:
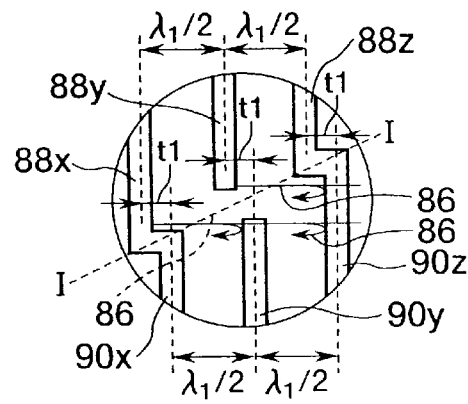
FIG. 22C is an enlargement of area S in FIG. 22A.

FIGS. 22A, 22B, and 22C illustrate a method of apodizing the electrode fingers 14 of an interdigital transducer 12 in series-arm SAW resonator according to the above-mentioned condition B, which has three parts: $B_1$, $B_2$, and $B_3$. FIG. 22B is an enlargement of area Q in FIG. 22A, while FIG. 22C is an enlargement of area S in FIG. 22A.

The apodization pattern is linear, as shown in FIG. 22A, with 15% to 40% of the electrode fingers 14 apodized at each end of the interdigital transducer 12, so that 30% to 80% of all of the electrode fingers in the interdigital transducer are apodized (condition $B_1$). The overlap length of the electrode fingers increases from both ends of the interdigital transducer 12 toward the center. The apodization creates excitation regions 82a and 82b with isosceles triangular shapes, and dummy regions 84a, 84b, 84c, and 84d with right triangular shapes. It is convenient to refer to regions 82a and 82b collectively as a SAW excitation region 82, and to regions 84a, 84b, 84c, and 84d collectively as the dummy region 84. Each apodized electrode finger 14 then comprises a first part disposed in the excitation region 82, and a second part disposed in the dummy region 84 (condition $B_2$).

The reflectors 20 are separated from the interdigital transducer 12 by the conventional distance of $\lambda_1/2$, as illustrated in FIG. 22B, where $\lambda_1$ is the wavelength of the surface acoustic waves 86 excited by the interdigital transducer 12. As shown in FIG. 22C, however, the portions of the electrode fingers 14 in the dummy regions 84a, 84b, 84c, and 84d are offset by a distance $t_1$ from the portions of the electrode fingers in the excitation regions 82a and 82b. The distance $t_1$ can have an arbitrary value in the range from 0.05 $\lambda_1$ to 0.31 $\lambda_1$. Thus the following condition $B_3$ is satisfied:

Condition $B_3$: $0.05 \lambda_1 \leq t_1 \leq 0.31 \lambda_1$

In FIG. 22C, the electrode-finger portions 88x, 88y, and 88z above line I—I lie within SAW excitation region 82a, while the electrode-finger portions 90x, 90y, and 90z below line I—I lie in dummy region 84d. The spacing between electrode-finger portions 88x and 88y, between electrode-finger portions 88y and 88z, between electrode-finger portions 90x and 90y, and between electrode-finger portions 90y and 90z is the conventional $\lambda_1/2$ spacing. At the point where each electrode finger crosses the boundary between the excitation region 82a and dummy region 84d, however, the electrode-finger position is shifted by the above distance $t_1$ toward the end of the interdigital transducer, in the direction of propagation of the surface acoustic waves.

When, for example, a surface acoustic wave 86 excited by electrode-finger portion 88x is reflected by electrode-finger portion 90y, the distance of electrode-finger portion 90y from electrode-finger portion 88x is $\lambda_1/2+t_1$, or $0.50 \lambda_1+t_1$, which from the above condition $B_3$ has a value between 0.55 $\lambda$ to 0.81 $\lambda$.

When the surface acoustic wave 86 excited by electrode-finger portion 88x is reflected by electrode-finger portion 90z, the distance of electrode-finger portion 90z from electrode-finger portion 88x is $(2 \times \lambda_1/2)+t_1$. Similar reflections by other electrode-finger portions in dummy region 84d, or in the reflector 20 to the right of dummy region 84d, will take place at distances from electrode-finger portion 88x of $(N \times \lambda_1/2)+t_1$, where N takes on various positive integer values. From condition $B_3$, it follows that all reflection distances are in ranges from $(N/2+0.55)\lambda_1$ to $(N/2+0.81)\lambda_1$, (N=0, 1, . . . ), which is the same as in a SAW resonator with reflectors 20 satisfying the condition A given in the first aspect of the invention. The same effect of improved attenuation in the upper stopband will therefore be obtained.

The reason for apodizing 30% to 80% of the electrode fingers 14 is explained in FIGS. 23A, 24A, 25A, 26A, and 27A, which show transfer characteristics of five SAW resonators with various degrees of apodization, and FIGS. 23B, 24B, 25B, 26B, and 27B, which show reflection characteristics of these SAW resonators in the form of Smith charts. The amount of apodization is 0% (no apodization) in FIGS.

Figure 24A:
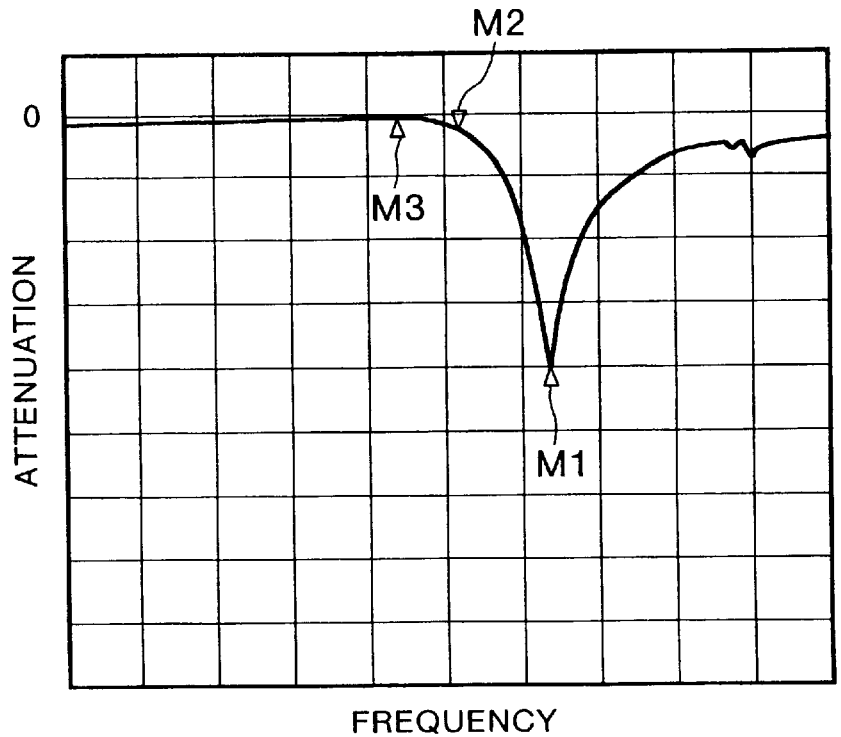
Figure 24B:
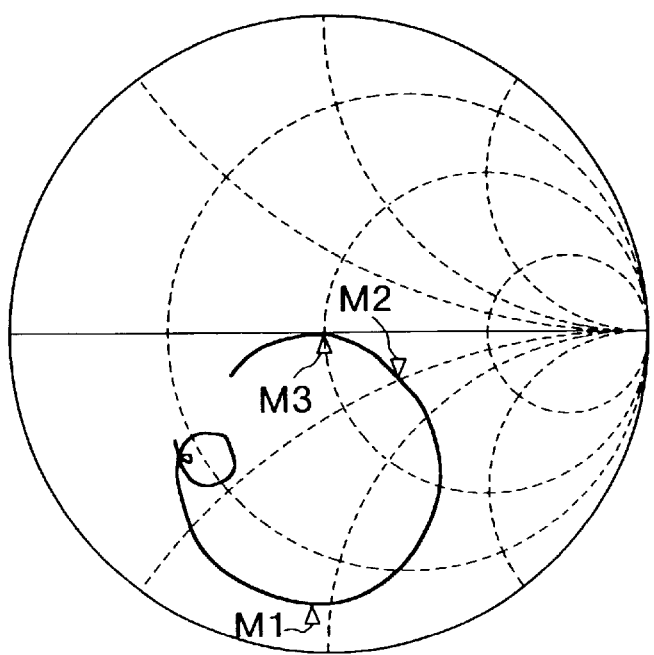
Figure 25A:
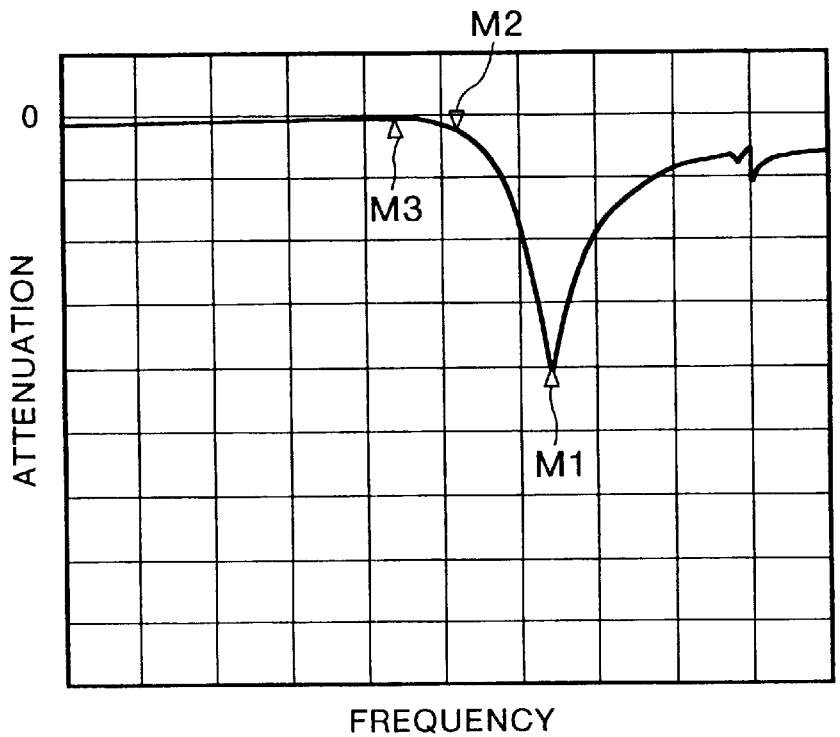
Figure 25B:
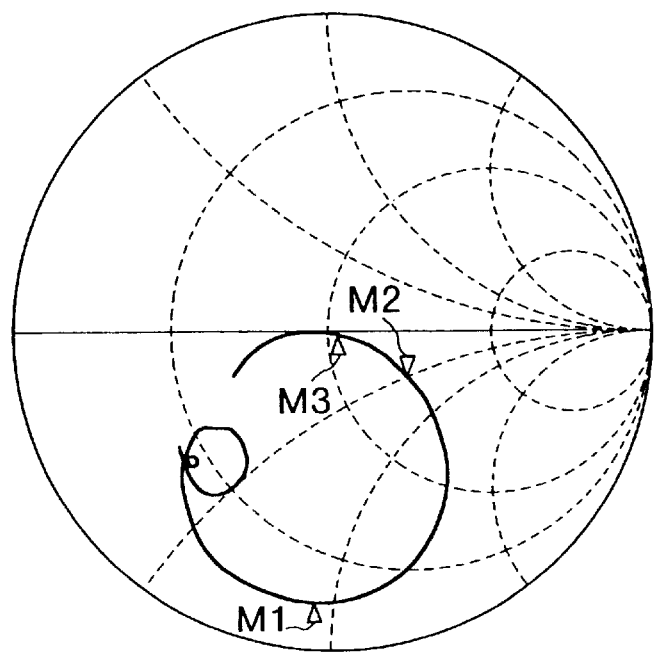
Figure 26A:
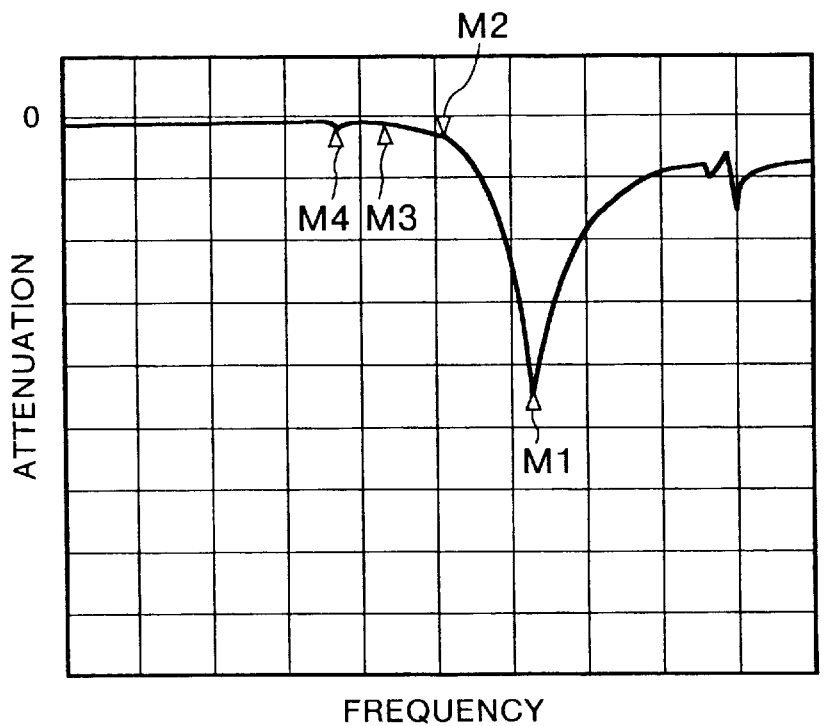
Figure 26B:
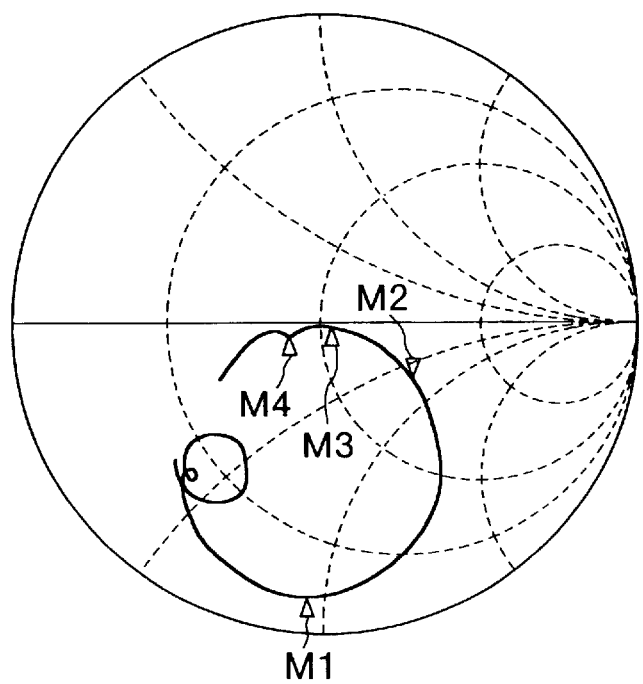
Figure 27A:
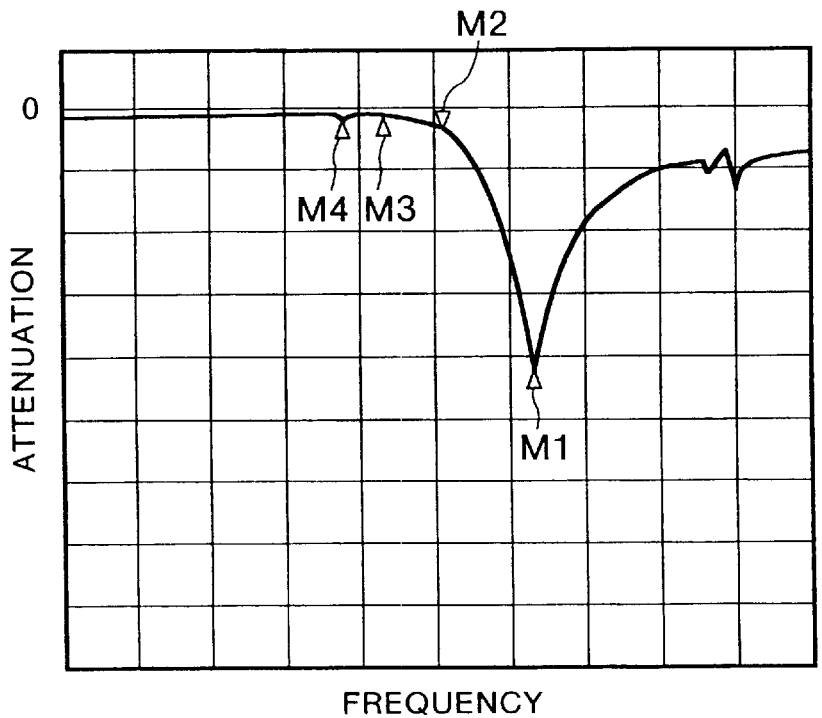
Figure 27B:
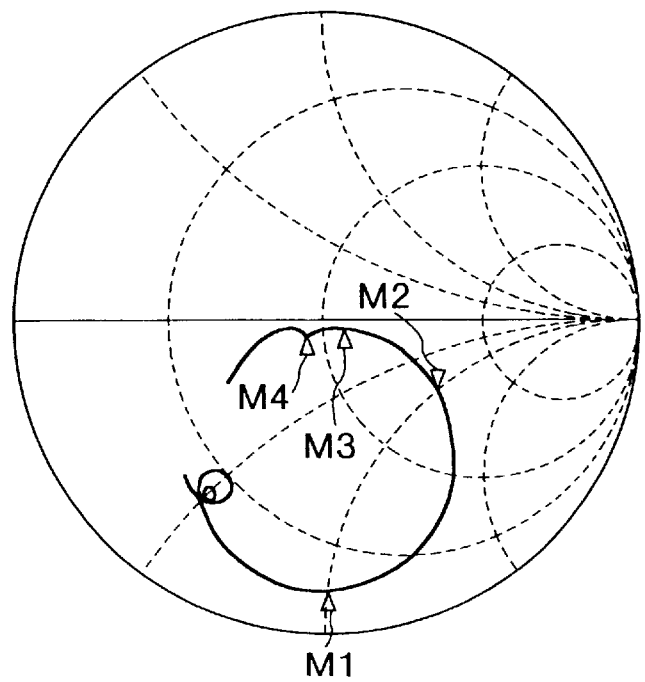

23A and 23B, 33% in FIGS. 24A and 24B, 50% in FIGS. 25A and 25B, 83% in FIGS. 26A and 26B, and 100% in FIGS. 27A and 27B. Linear apodization patterns are employed, similar to those in FIG. 22A.

Figure 23A:
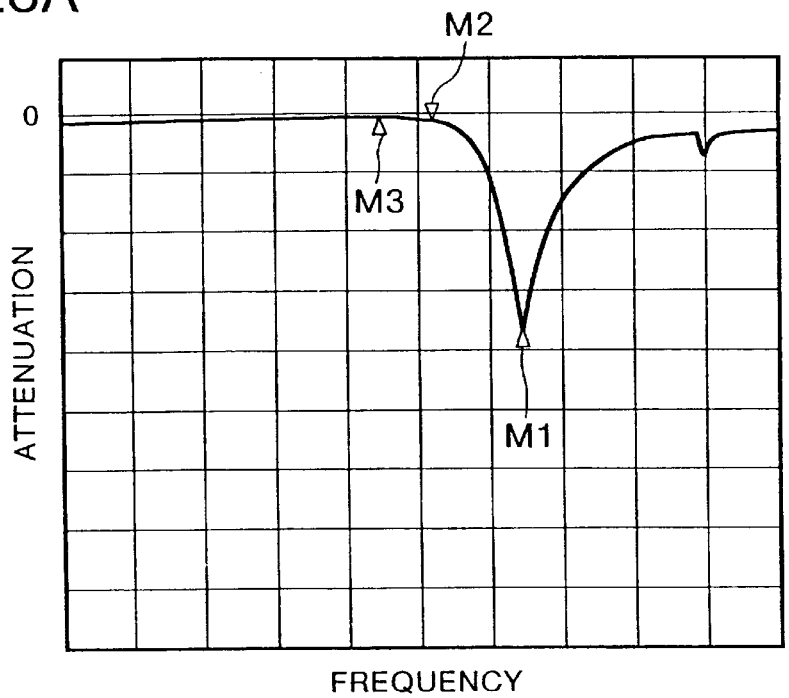
FIGS. 23A, 24A, 25A, 26A, and 27A illustrate transfer characteristics of series-coupled SAW resonators with various levels of apodization.
Figure 23B:
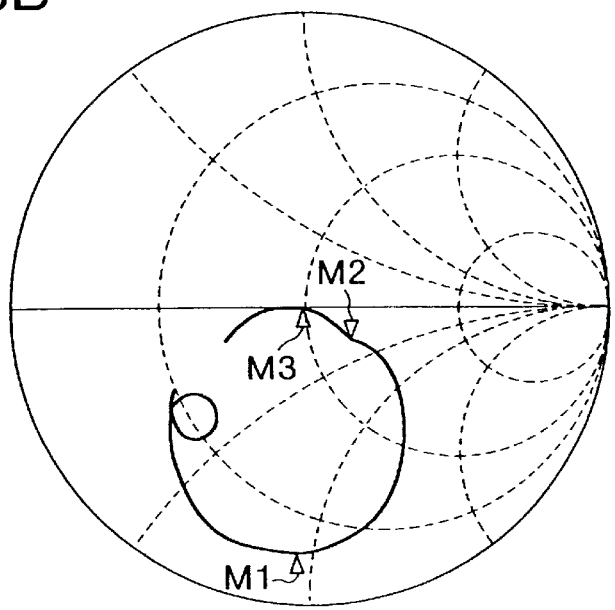
FIGS. 23B, 24B, 25B, 26B, and 27B illustrate reflection characteristics of series-coupled SAW resonators with various levels of apodization.
Figure 23C:
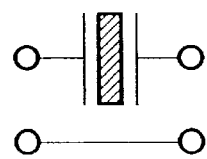
FIG. 23C illustrates the coupling of the SAW resonators in FIGS. 23A to 27B.

In all five SAW resonators, the distance t between the interdigital transducer 12 and reflectors 20 is $\lambda/2$, as in FIG. 22B, where $\lambda$ is the wavelength of the surface acoustic wave. Each SAW resonator is coupled in the series configuration shown in FIG. 23C. The interdigital transducer of each SAW resonator comprises aluminum, copper, or an aluminum alloy containing a few percent of silicon. The interdigital transducer has one hundred twenty electrode pairs, formed on a 36° rotated Y-cut LiTaO$_3$ substrate, with a static capacitance of $4 \times 10^2$ pF per unit length per pair of electrode fingers, an overlap length of 100 $\mu$m at the center of the interdigital transducer, and a static capacitance $C_0$ of 4.80 pF as calculated by the formula given previously:

$C_0$=(number of pairs)×(overlap length)×(static capacitance per unit length per unit pair)

Markers M1 to M3 in these drawings are set as follows. Marker M1 indicates the position of the pole of attenuation due to the antiresonant frequency. Marker M2 indicates ripple due to harmonic modes. Marker M3 is located at a frequency position 20 MHz lower than marker M1, at what would be the high-frequency end of the passband of an 800-MHz-band resonator-type SAW filter. Table 4 indicates the attenuation at marker M3 for the five apodization levels.

TABLE 4

|    | 0%      | 33%     | 50%     | 83%     | 100%    |
|----|---------|---------|---------|---------|---------|
| M3 | −0.3480 | −0.3839 | −0.3989 | −0.4572 | −0.5358 |

Attenuation (dB)

As can be seen from a comparison of the characteristics in FIGS. 23A to 27B, as the degree of apodization is increased, the deformity at marker M2 in the reflection characteristic disappears, but at apodization levels of 83% and 100%, spurious components appear at the position of marker M4 in FIGS. 26A, 26B, 27A, and 27B. The spurious components at marker M4 are located in the middle of the passband, and the loss at marker M3 is increased by the effect of the ripple at marker M4, making linear apodization levels of 83% or more undesirable in a series-arm SAW resonator in a resonator-type SAW filter.

At the apodization level of 33%, as shown in FIGS. 25A and 25B, the deformity at marker M2 is mostly eliminated. Taken together, these drawings indicate that the desirable amount of apodization lies in the range from about 30% to 80%.

The size of the reflectors 20 of the series-arm SAW resonators can be reduced in accordance with the amount of reflection that takes place due to the apodization in the interdigital transducer 12. At comparatively high apodization levels, it may be possible to eliminate the reflectors 20 completely.

Variations

The examples shown above have all been of multi-stage resonator-type SAW filters, but the first and second aspects of the invention can both be practiced in a single-stage resonator-type SAW filter with only one series-arm SAW resonator and only one shunt-arm SAW resonator.

In a multi-stage filter including two or more shunt-arm SAW resonators (not a two-stage T-type filter), when the second aspect of the invention is applied to the shunt-arm SAW resonators, the apodization level need not be the same in all of the shunt-arm SAW resonators. Two or more different apodization levels in the range from 50% to 100% may be employed in different shunt-arm SAW resonators.

Similarly, in a multi-stage filter including two or more series-arm SAW resonators (not a two-stage $\pi$-type filter), when the second aspect of the invention is applied to the series-arm SAW resonators, the apodization level need not be the same in all of the series-arm SAW resonators. Two or more different apodization levels in the range from 30% to 80% may be employed in different series-arm SAW resonators. Each series-arm SAW resonator may have a different apodization level in this range. Furthermore, the value $t_1$ of the positional offset between the excitation and dummy portions of the electrode fingers need not be the same in all of the series-arm SAW resonators. Each series-arm SAW resonator may have a different value of $t_1$ in the range from 0.05 $\lambda_1$ to 0.31 $\lambda_1$, satisfying condition B$_3$.

The separation between the interdigital transducer and reflectors in the shunt-arm SAW resonators, or in series-arm SAW resonators not satisfying condition A, may be (N/2+ 0.5)$\lambda_1$, where N is an arbitrary non-negative integer.

The apodization pattern when the second aspect of the invention is applied in the series-arm or shunt-arm SAW resonators does not have to be linear. Effects similar to those described above can be obtained from other apodization patterns (a cosine pattern, for example).

The invention can also be practiced when the piezoelectric substrate material and the conductive materials constituting the interdigital transducers and reflectors are other than described above, or in filters designed for use in frequency bands other than the 800-MHz band, with passband widths and stopband widths different from those mentioned above. Similar effects can be anticipated, although the condition on the film thickness (H/$\lambda \geq$ C) and the shapes and positions of the spurious components may change slightly.

Those skilled in the art will recognize that further variations are possible within the scope claimed below.

What is claimed is:

1. A resonator-type surface-acoustic-wave filter having at least one series-arm surface-acoustic-wave resonator and at least one shunt-arm surface-acoustic-wave resonator coupled in a ladder circuit configuration, at least one said series-arm surface-acoustic-wave resonator having an interdigital transducer and a pair of reflectors disposed on opposite sides of said interdigital transducer, wherein:

at least one said series-arm surface-acoustic-wave resonator satisfies the following condition A:
  (condition A) said reflectors are separated from said interdigital transducer by a distance t of at least (N/2+0.55)$\lambda_1$ but not more than (N/2+0.81)$\lambda_1$, where N is an arbitrary non-negative integer, and $\lambda_1$ is a wavelength of a surface acoustic wave excited by said series-arm surface-acoustic-wave resonator;

and wherein
  every said series-arm surface-acoustic-wave resonator has an interdigital transducer with electrode fingers mutually separated by a distance of $\lambda_1/2$;
in every said series-arm surface-acoustic-wave resonator having reflectors, said reflectors have electrode fingers mutually separated by said distance of $\lambda_1/2$;
every said shunt-arm surface-acoustic-wave resonator has an interdigital transducer with electrode fingers mutually separated by a distance of $\lambda_2/2$, where $\lambda_2$ is a wavelength of a surface acoustic wave excited by said shunt-arm surface-acoustic-wave-resonator; and
in every said shunt arm surface-acoustic-wave resonator having reflectors, said reflectors have electrode fingers mutually separated by said distance of $\lambda_2/2$.

2. The filter of claim 1, wherein N is zero.

3. The filter of claim 1, comprising only one series-arm surface-acoustic-wave resonator.

4. The filter of claim 1, comprising more than one series-arm surface-acoustic-wave resonator.

5. The filter of claim 4, wherein at least two series-arm surface-acoustic-wave resonators in said filter satisfy said condition A.

6. The filter of claim 5, wherein said distance t is identical in all series-arm surface-acoustic-wave resonators that satisfy said condition A.

7. A resonator-type surface-acoustic-wave filter having only one single series-arm surface-acoustic-wave resonator and at least one shunt-arm surface-acoustic-wave resonator coupled in a ladder circuit configuration, said series-arm surface-acoustic-wave resonator having an interdigital transducer and a pair of reflectors disposed on opposite sides of said interdigital transducer, wherein:

said series-arm surface-acoustic-wave resonator satisfies the following condition A:
(condition A) said reflectors are separated from said interdigital transducer by a distance t of at least $(N/2+0.55)\lambda_1$ but not more than $(N/2+0.81)\lambda_1$, where N is an arbitrary non-negative integer, and $\lambda_1$ is a wavelength of a surface acoustic wave excited by said series-arm surface-acoustic-wave resonator; and every said shunt-arm surface-acoustic-wave resonator comprises an interdigital transducer with electrode fingers, and at least half of said electrode fingers are apodized.

8. The filter of claim 7, wherein at least one said shunt-arm surface-acoustic-wave resonator also comprises a pair of reflectors disposed on opposite sides of the interdigital transducer of said shunt-arm surface-acoustic-wave resonator.

9. The filter of claim 7, wherein every said shunt-arm surface-acoustic-wave resonator has no reflectors.

10. A resonator-type surface-acoustic-wave filter having a plurality of series-arm surface-acoustic-wave resonators and at least one shunt-arm surface-acoustic-wave resonator coupled in a ladder circuit configuration, at least two of said series-arm surface-acoustic-wave resonators having respective interdigital transducers and respective pairs of reflectors disposed on opposite sides of the respective interdigital transducers, wherein:

said at least two series-arm surface-acoustic-wave resonators satisfy the following condition A:
(condition A) said reflectors are separated from said interdigital transducer by a distance t of at least $(N/2+0.55)\lambda_1$ but not more than $(N/2+0.81)\lambda_1$, where N is an arbitrary non-negative integer, and $\lambda_1$ is a wavelength of a surface acoustic wave excited by said series-arm surface-acoustic-wave resonators; and said distance t is not identical in all series-arm surface-acoustic-wave resonators that satisfy said condition A.

11. A resonator-type surface-acoustic-wave filter having a plurality of series-arm surface-acoustic-wave resonators and at least one shunt-arm surface-acoustic-wave resonator coupled in a ladder circuit configuration, at least two of said series-arm surface-acoustic-wave resonators having respective interdigital transducers and respective pairs of reflectors disposed on opposite sides of the respective interdigital transducers, wherein:

said at least two series-arm surface-acoustic-wave resonators satisfy the following condition A:
(condition A) said reflectors are separated from said interdigital transducer by a distance t of at least $(N/2+0.55)\lambda_1$ but not more than $(N/2+0.81)\lambda_1$, where N is an arbitrary non-negative integer, and $\lambda_1$ is a wavelength of a surface acoustic wave excited by said series-arm surface-acoustic-wave resonators; and said distance t differs in every series-arm surface-acoustic-wave resonator that satisfies said condition A.

12. A resonator-type surface-acoustic-wave filter having a plurality of series-arm surface-acoustic-wave resonators and at least one shunt-arm surface-acoustic-wave resonator coupled in a ladder circuit configuration, at least one of said series-arm surface-acoustic-wave resonators having an interdigital transducer and a pair of reflectors disposed on opposite sides of said interdigital transducer, wherein:

said at least one of said series-arm surface-acoustic-wave resonators satisfies the following condition A:
(condition A) said reflectors are separated from said interdigital transducers by a distance t of at least $(N/2+0.55)\lambda_1$ but not more than $(N/2+0.81)\lambda_1$, where N is an arbitrary non-negative integer and $\lambda_1$ is a wavelength of a surface acoustic wave excited by said series-arm surface-acoustic-wave resonators; and every said shunt-arm surface-acoustic-wave resonator comprises an interdigital transducer with electrode fingers, and at least half of said electrode fingers are apodized.

13. The filter of claim 12, wherein at least one said shunt-arm surface-acoustic-wave resonator also comprises a pair of reflectors disposed on opposite sides of the interdigital transducer of said shunt-arm surface-acoustic-wave resonator.

14. The filter of claim 12, wherein every said shunt-arm surface-acoustic-wave resonator has no reflectors.

15. The filter of claim 12, wherein at least two series-arm surface-acoustic-wave resonators in said filter satisfy said condition A.

16. The filter of claim 15, wherein said distance t is identical in all series-arm surface-acoustic-wave resonators that satisfy said condition A.

17. The filter of claim 15, wherein said distance t is not identical in all series-arm surface-acoustic-wave resonators that satisfy said condition A.

18. The filter of claim 15, wherein said distance t differs in every series-arm surface-acoustic-wave resonator that satisfies said condition A.

19. A resonator-type surface-acoustic-wave filter having a plurality of series-arm surface-acoustic-wave resonators and at least one shunt-arm surface-acoustic-wave resonator coupled in a ladder circuit configuration, each of said series-arm surface-acoustic-wave resonators having a respective interdigital transducer, at least a first one of said series-arm surface-acoustic-wave resonators also having a pair of reflectors disposed on opposite sides of said interdigital transducer, wherein:

said first one of said series-arm surface-acoustic-wave resonator satisfies the following condition A:
(condition A) said reflectors are separated from said interdigital transducer by a distance t of at least $(N/2+0.55)\lambda_1$ but not more than $(N/2+0.81)\lambda_1$, where N is an arbitrary non-negative integer, and $\lambda_1$ is a wavelength of a surface acoustic wave excited by said series-arm surface-acoustic-wave resonator; and at least a second one of said series-arm surface-acoustic-wave resonators does not satisfy said condition A but satisfies instead a condition B having three parts as follows:

(first part of condition B) said interdigital transducers has electrode fingers, and at least thirty percent but not more than eighty percent of said electrode fingers are apodized, thereby creating within said interdigital transducers an excitation region for exciting surface acoustic waves and at least one dummy region for reflecting said surface acoustic waves;

(second part of condition B) each of the electrode fingers that are apodized comprises a first part disposed in said excitation region and a second part disposed in said at least one dummy region; and (third part of condition B) said first part is offset from said second part by a distance $t_1$ equal to at least 0.05 $\lambda_1$ but not more than 0.31 $\lambda_1$ in the direction of propagation of said surface acoustic waves.

20. The filter of claim 19, wherein said second one of said series-arm surface-acoustic-wave resonators that satisfies said condition B also comprises a pair of reflectors disposed on opposite sides of the interdigital transducer of said second one of said series-arm surface-acoustic-wave resonators.

21. The filter of claim 19, wherein every series-arm surface-acoustic-wave resonator that satisfies said condition B has no reflectors.

22. The filter of claim 19, wherein every said shunt-arm surface-acoustic-wave resonator comprises an interdigital transducer with electrode fingers, and at least half of the electrode fingers in said shunt-arm surface-acoustic-wave resonator are apodized.

23. The filter of claim 22, wherein at least one said shunt-arm surface-acoustic-wave resonator also comprises a pair of reflectors disposed on opposite sides of the interdigital transducer of said shunt-arm surface-acoustic-wave resonator.

24. The filter of claim 22, wherein every said shunt-arm surface-acoustic-wave resonator has no reflectors.

25. A resonator-type surface-acoustic-wave filter having at least one series-arm surface-acoustic-wave resonator and at least one shunt-arm surface-acoustic-wave resonator coupled in a ladder circuit configuration, each said series-arm surface-acoustic-wave resonator having an interdigital transducer with electrode fingers, which excite surface acoustic waves with a wavelength $\lambda_1$, wherein:

at least one said series-arm surface-acoustic-wave resonator satisfies a condition B having three parts as follows:

(first part of condition B) at least thirty percent but not more than eighty percent of the electrode fingers of said series-arm surface-acoustic-wave resonator are apodized, thereby creating within said interdigital transducer an excitation region and at least one dummy region;

(second part of condition B) each of the electrode fingers that are apodized comprises a first part disposed in said excitation region and a second part disposed in said at least one dummy region; and (third part of condition B) said first part is offset from said second part by a distance $t_1$ equal to at least 0.05$\lambda_1$ but not more than 0.31$\lambda_1$ in the direction of propagation of said acoustic waves.

26. The filter of claim 25, wherein at least one said series-arm surface-acoustic-wave resonator that satisfies said condition B also comprises a pair of reflectors disposed on opposite sides of the interdigital transducer of said series-arm surface-acoustic-wave resonator.

27. The filter of claim 25, wherein every series-arm surface-acoustic-wave resonator that satisfies said condition B has no reflectors.

28. The filter of claim 25, wherein said ladder circuit configuration has only one series-arm surface-acoustic-wave resonator.

29. The filter of claim 28, wherein every said shunt-arm surface-acoustic-wave resonator comprises an interdigital transducer with electrode fingers, and at least half of the electrode fingers in said shunt-arm surface-acoustic-wave resonator are apodized.

30. The filter of claim 29, wherein at least one said shunt-arm surface-acoustic-wave resonator also comprises a pair of reflectors disposed on opposite sides of the interdigital transducer of said shunt-arm surface-acoustic-wave resonator.

31. The filter of claim 29, wherein every said shunt-arm surface-acoustic-wave resonator has no reflectors.

32. The filter of claim 25, wherein said ladder circuit configuration comprises more than one series-arm surface-acoustic-wave resonator.

33. The filter of claim 32, wherein at least two series-arm surface-acoustic-wave resonators in said filter satisfy said condition B.

34. The filter of claim 33, wherein said distance $t_1$ is identical in all series-arm surface-acoustic-wave resonators that satisfy said condition B.

35. The filter of claim 33, wherein said distance $t_1$ is not identical in all series-arm surface-acoustic-wave resonators that satisfy said condition B.

36. The filter of claim 33, wherein said distance $t_1$ differs in every series-arm surface-acoustic-wave resonator that satisfies said condition B.

37. The filter of claim 32, wherein every said shunt-arm surface-acoustic-wave resonator comprises an interdigital transducer with electrode fingers, and at least half of the electrode fingers in said shunt-arm surface-acoustic-wave resonator are apodized.

38. The filter of claim 37, wherein at least one said shunt-arm surface-acoustic-wave resonator also comprises a pair of reflectors disposed on opposite sides of the interdigital transducer of said shunt-arm surface-acoustic-wave resonator.

39. The filter of claim 37, wherein every said shunt-arm surface-acoustic-wave resonator has no reflectors.

40. The filter of claim 37, wherein at least two series-arm surface-acoustic-wave resonators in said filter satisfy said condition B.

41. The filter of claim 40, wherein said distance $t_1$ is identical in all series-arm surface-acoustic-wave resonators that satisfy said condition B.

42. The filter of claim 40, wherein said distance $t_1$ is not identical in all series-arm surface-acoustic-wave resonators that satisfy said condition B.

43. The filter of claim 40, wherein said distance $t_1$ differs in every series-arm surface-acoustic-wave resonator that satisfies said condition B.

* * * * *